(12) United States Patent
Chen et al.

(10) Patent No.: US 12,272,622 B2
(45) Date of Patent: *Apr. 8, 2025

(54) PACKAGE AND MANUFACTURING METHOD THEREOF

(71) Applicant: Taiwan Semiconductor Manufacturing Company, Ltd., Hsinchu (TW)

(72) Inventors: Ming-Fa Chen, Taichung (TW); Sung-Feng Yeh, Taipei (TW); Jian-Wei Hong, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/325,104

(22) Filed: May 29, 2023

(65) Prior Publication Data

US 2023/0298973 A1 Sep. 21, 2023

Related U.S. Application Data

(63) Continuation of application No. 17/577,035, filed on Jan. 17, 2022, now Pat. No. 11,699,638, which is a
(Continued)

(51) Int. Cl.
*H01L 23/48* (2006.01)
*H01L 21/463* (2006.01)
*H01L 21/56* (2006.01)
*H01L 21/768* (2006.01)

*H01L 23/31* (2006.01)
*H01L 23/544* (2006.01)
(Continued)

(52) U.S. Cl.
CPC .......... *H01L 23/481* (2013.01); *H01L 21/463* (2013.01); *H01L 21/56* (2013.01); *H01L 21/76804* (2013.01); *H01L 23/3121* (2013.01); *H01L 23/544* (2013.01); *H01L 25/0657* (2013.01); *H01L 25/50* (2013.01)

(58) Field of Classification Search
CPC ...... H01L 23/481; H01L 21/463; H01L 21/56
See application file for complete search history.

(56) References Cited

U.S. PATENT DOCUMENTS 11,699,638 B2 * 7/2023 Chen .................... H01L 25/0657
257/774
2018/0261545 A1 * 9/2018 Sundaram ............... H01L 24/16
(Continued)

*Primary Examiner* — Thao P Le
(74) *Attorney, Agent, or Firm* — JCIPRNET

(57) ABSTRACT

A package includes a semiconductor carrier, a first die, a second die, a redistribution structure, and an electron transmission path. The first die is disposed over the semiconductor carrier. The second die is stacked on the first die. The redistribution structure is over the second die. The electron transmission path extends from the semiconductor carrier to the redistribution structure. The electron transmission path is electrically connected to a ground voltage. A first portion of the electron transmission path is embedded in the semiconductor carrier, a second portion of the electron transmission path is aside the first die, and a third portion of the electron transmission path is aside the second die.

20 Claims, 28 Drawing Sheets

Related U.S. Application Data continuation of application No. 16/745,355, filed on Jan. 17, 2020, now Pat. No. 11,227,812.

(60) Provisional application No. 62/892,552, filed on Aug. 28, 2019.

(51) Int. Cl.
*H01L 25/00* (2006.01)
*H01L 25/065* (2023.01)

(56) References Cited

U.S. PATENT DOCUMENTS

| | | | |
|---|---|---|---|
| 2021/0066168 A1* | 3/2021 | Chen | H01L 21/56 |
| 2021/0066248 A1* | 3/2021 | Chen | H01L 21/561 |
| 2021/0151428 A1* | 5/2021 | Dutta | H01L 23/481 |
| 2023/0074181 A1* | 3/2023 | Brun | H01L 23/5384 |
| 2023/0170327 A1* | 6/2023 | Yang | H01L 25/105 |
| | | | 257/737 |
| 2023/0187407 A1* | 6/2023 | Molnar | H01L 24/24 |
| | | | 257/777 |
| 2023/0197676 A1* | 6/2023 | Pasdast | H01L 23/49827 |
| | | | 257/668 |
| 2023/0246014 A1* | 8/2023 | Cheng | H01L 23/642 |
| | | | 257/532 |
| 2023/0369289 A1* | 11/2023 | Guo | H01L 23/49838 |
| 2024/0079337 A1* | 3/2024 | Marin | H01L 23/5386 |
| 2024/0079339 A1* | 3/2024 | Marin | H01L 24/73 |

* cited by examiner

PACKAGE AND MANUFACTURING METHOD THEREOF

CROSS-REFERENCE TO RELATED APPLICATION

This is a continuation application of and claims the priority benefit of U.S. application Ser. No. 17/577,035, filed on Jan. 17, 2022, now allowed. The prior U.S. application Ser. No. 17/577,035 is a continuation application of and claims the priority benefit of U.S. application Ser. No. 16/745,355, filed on Jan. 17, 2020. The prior U.S. application Ser. No. 16/745,355 claims the priority benefit of U.S. provisional application Ser. No. 62/892,552, filed on Aug. 28, 2019. The entirety of each of the above-mentioned patent applications is hereby incorporated by reference herein and made a part of this specification.

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies and applications have been developed for the wafer level packaging. Integration of multiple semiconductor devices has become a challenge in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
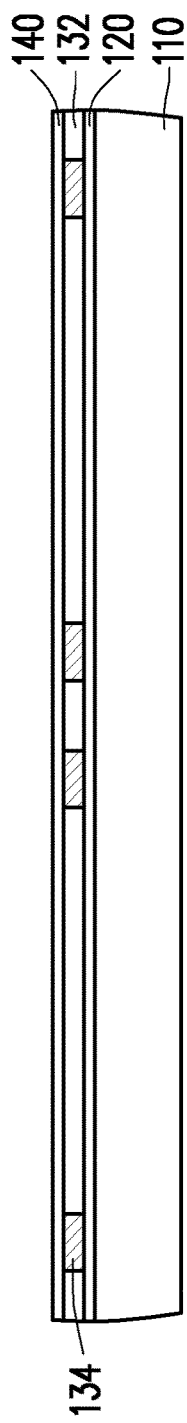
FIG. 1A to FIG. 1P are schematic cross-sectional views illustrating a manufacturing process of a package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
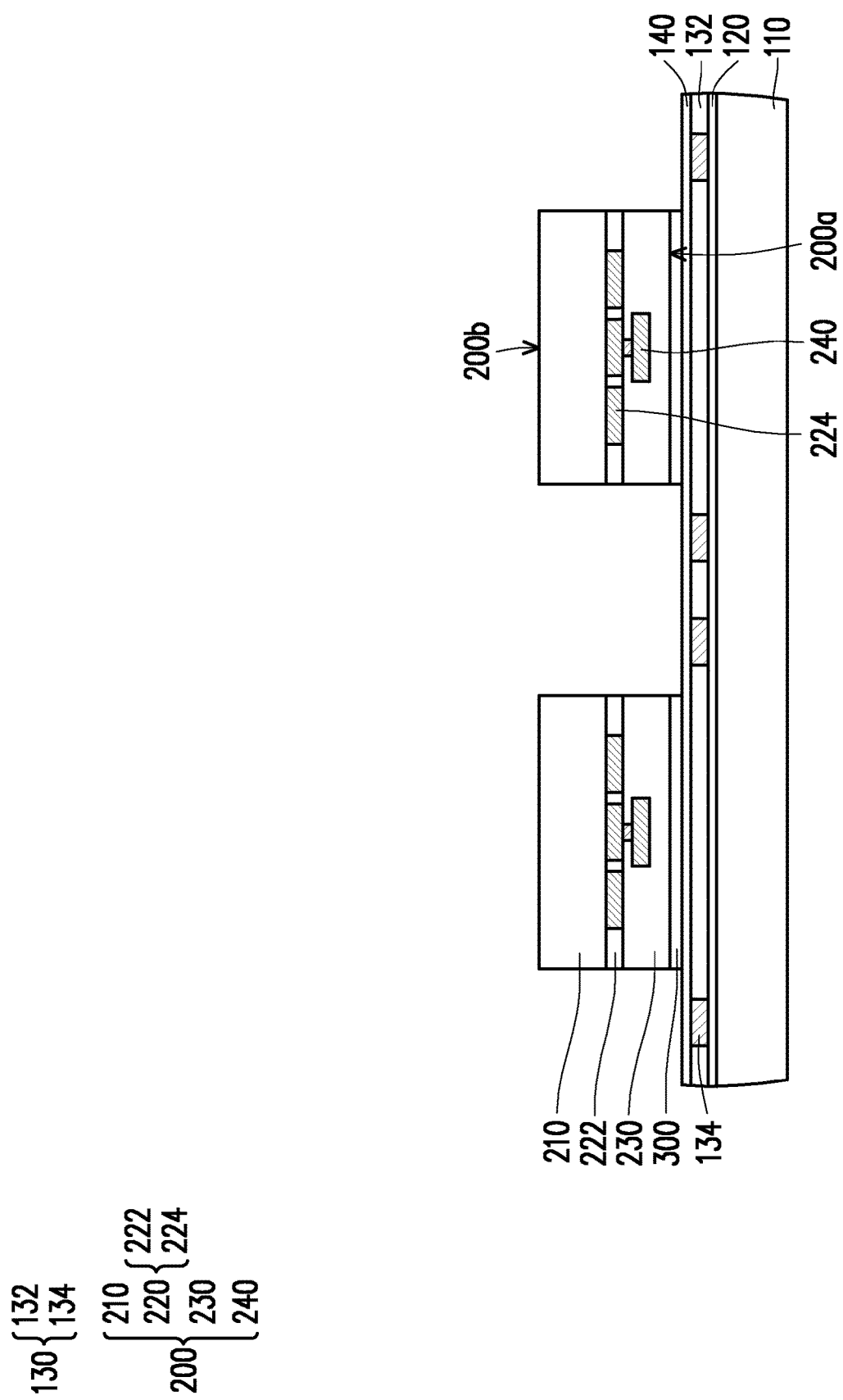
Figure 1C:
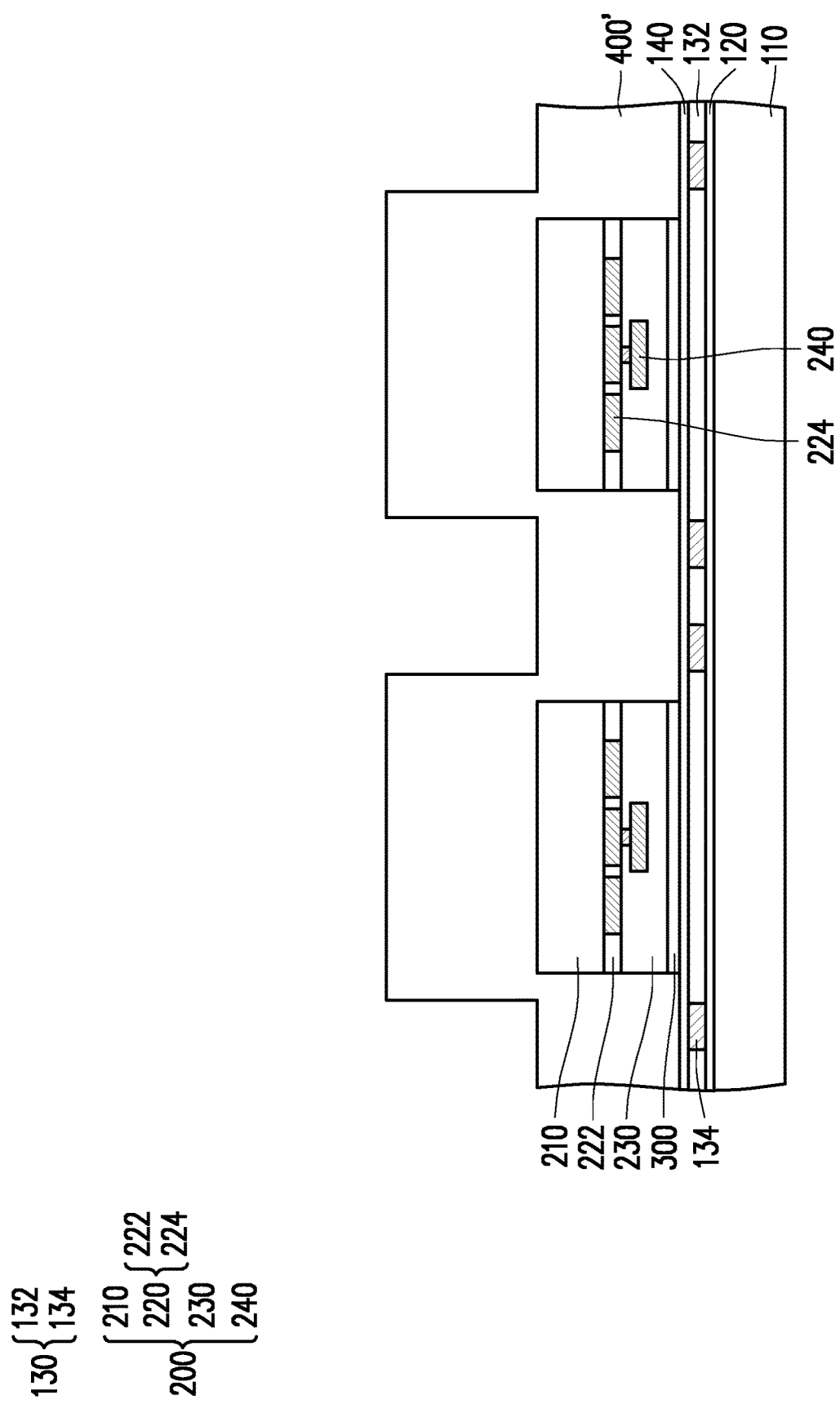
Figure 1D:
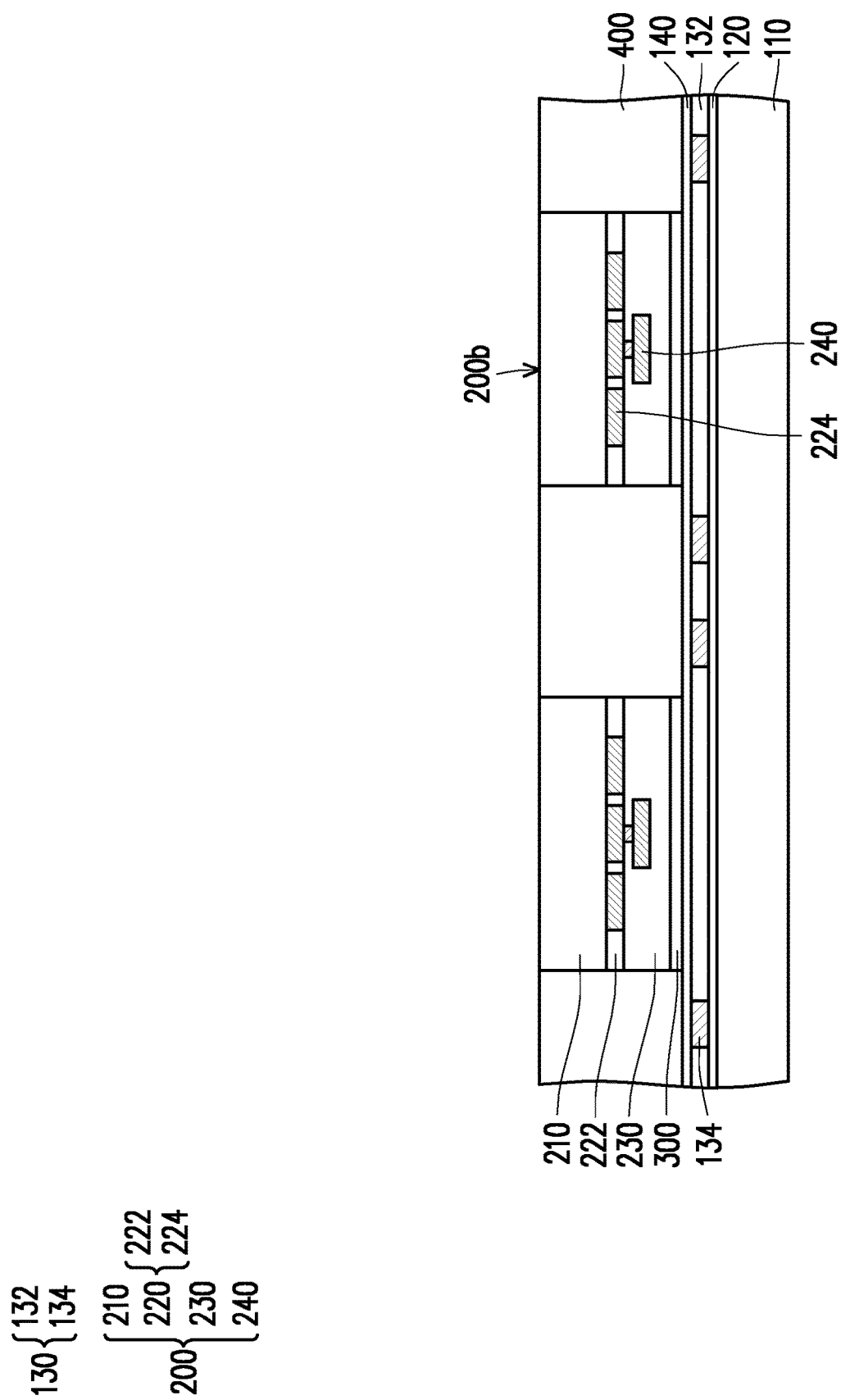
Figure 1E:
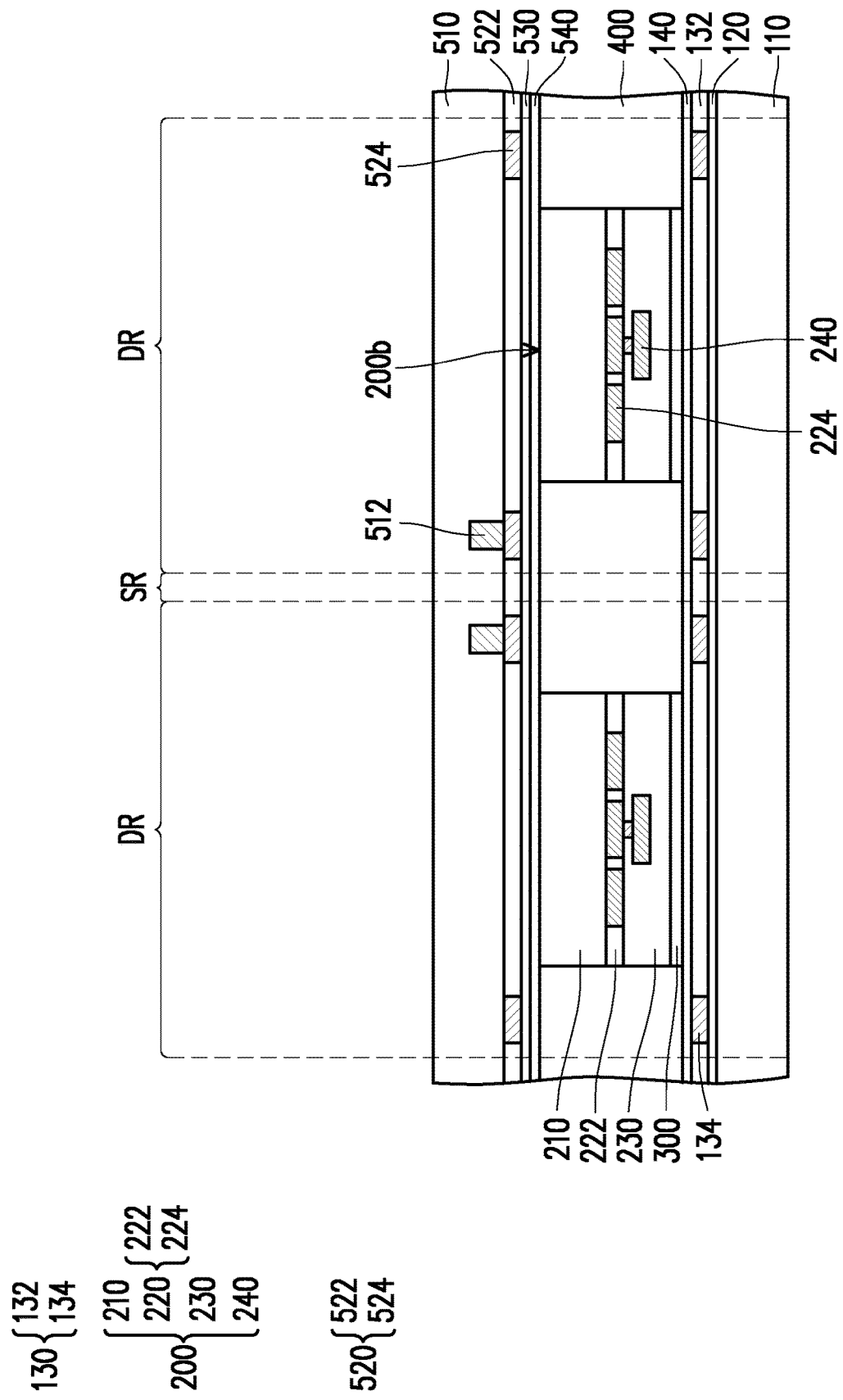
Figure 1F:
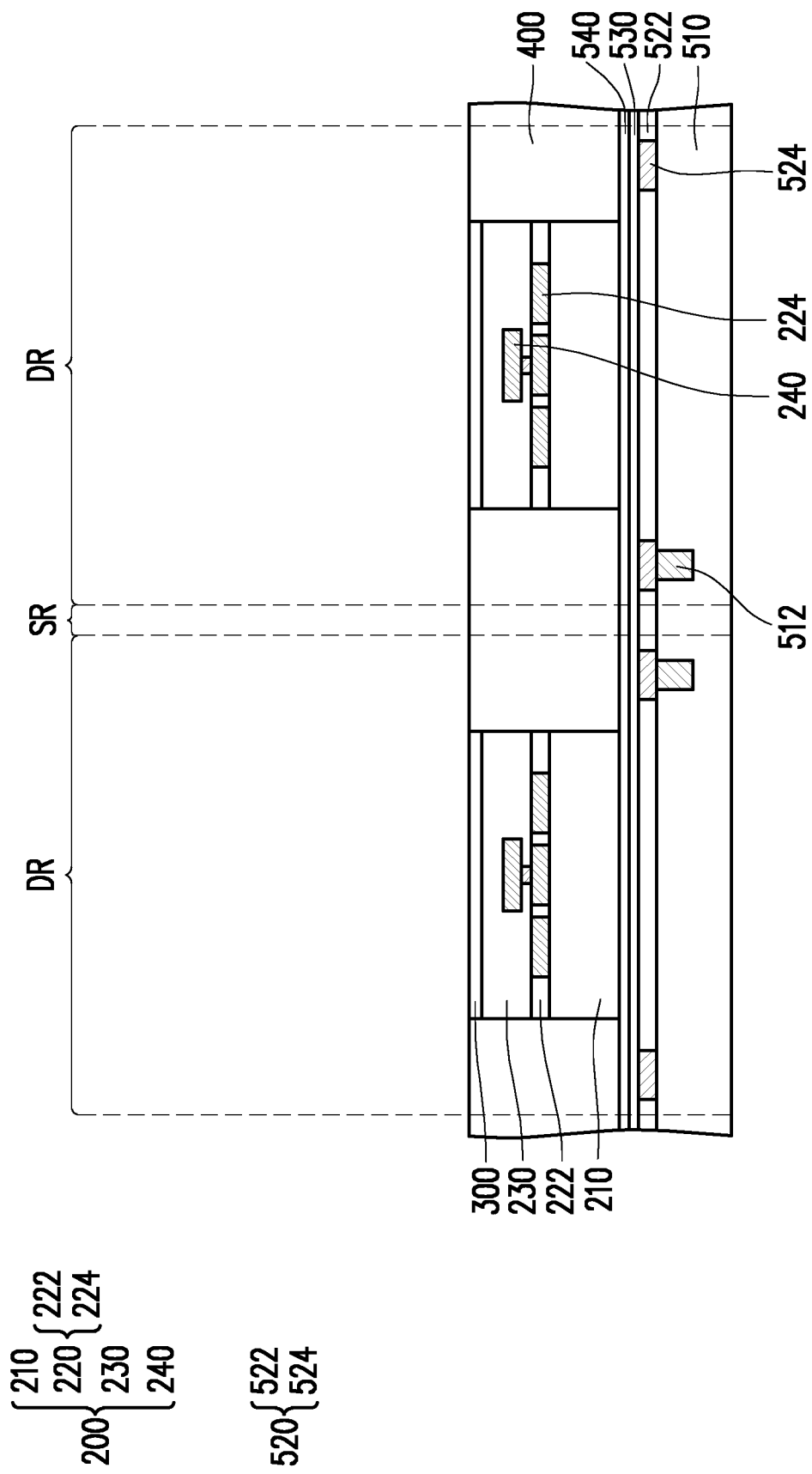
Figure 1G:
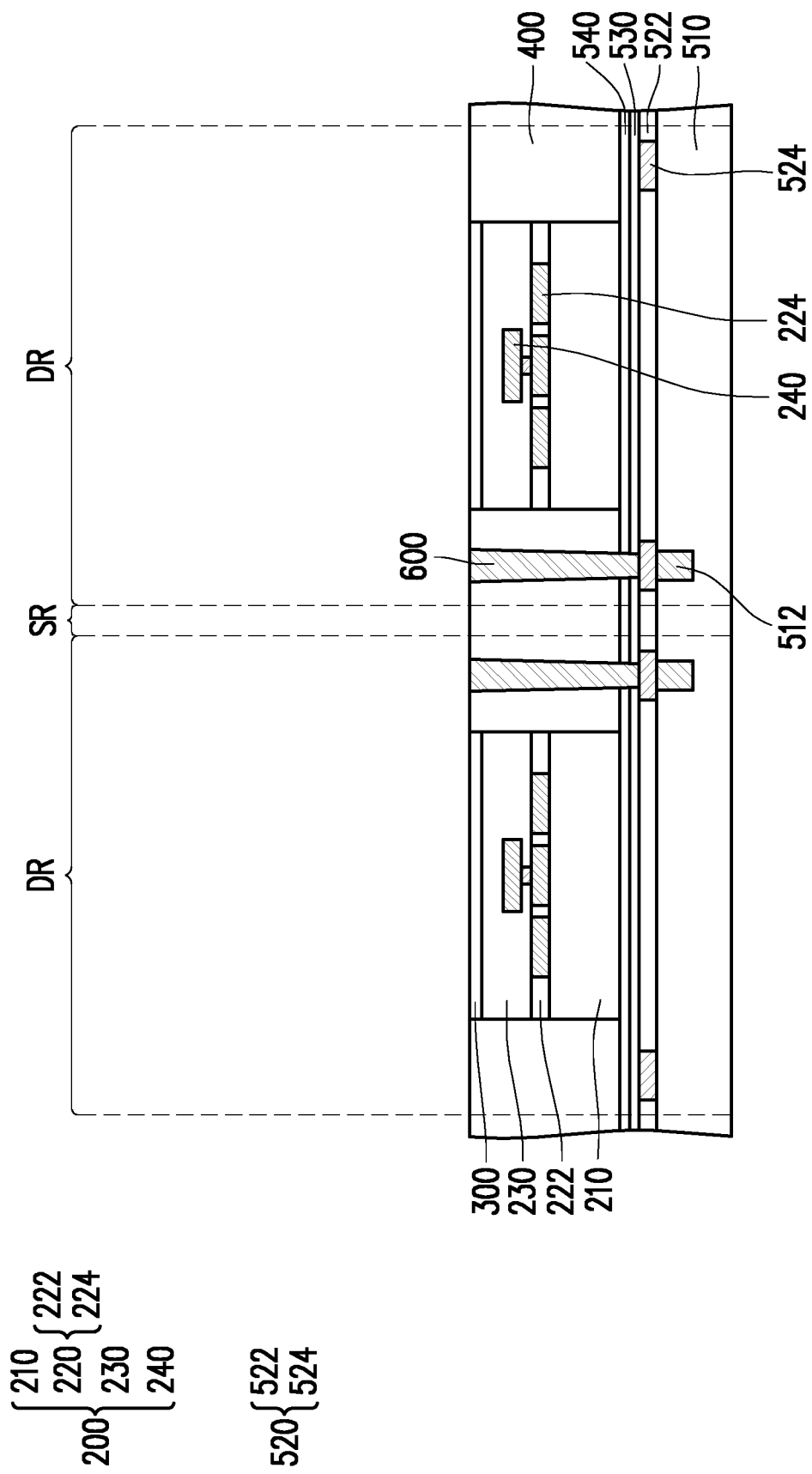
Figure 1H:
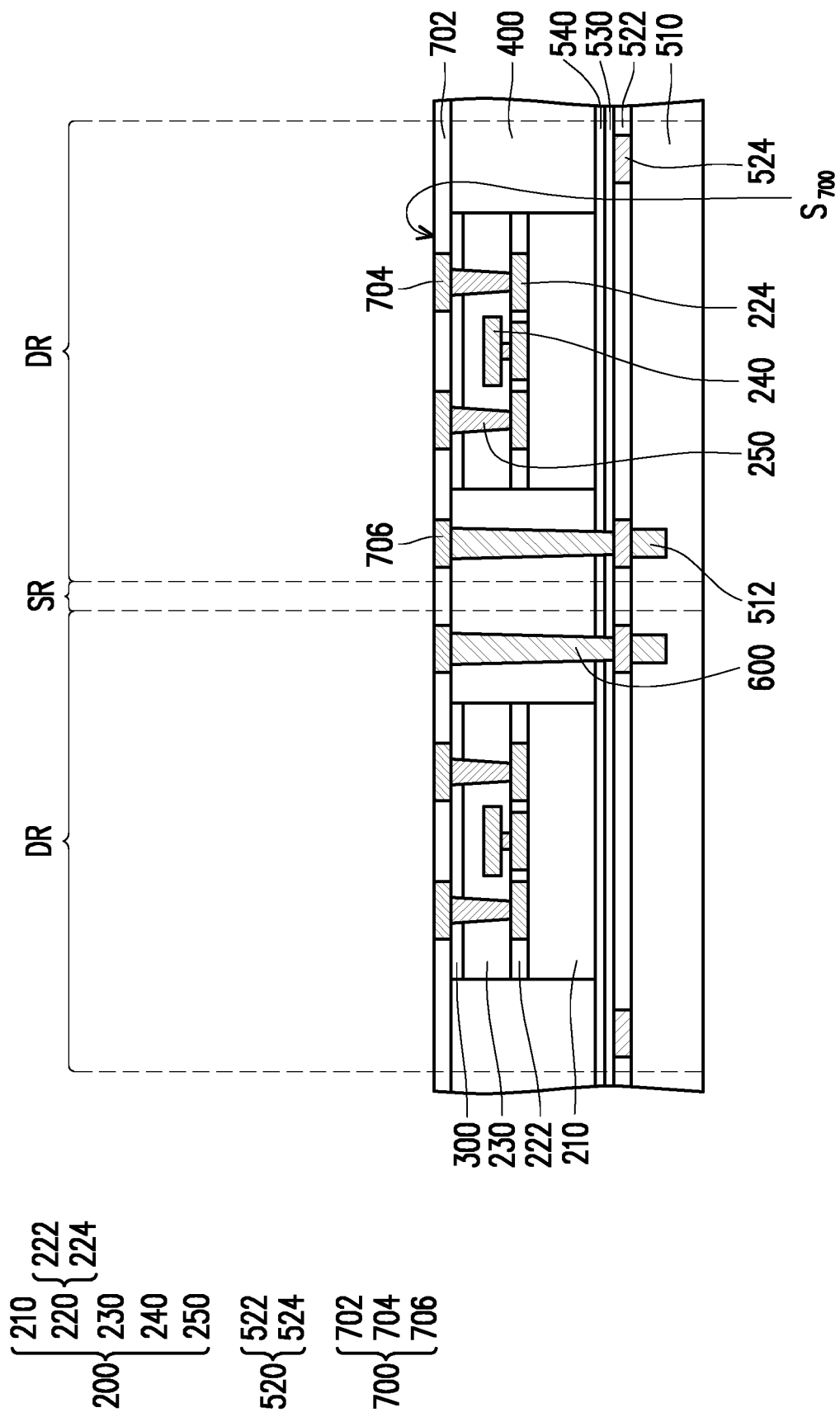
Figure 11:
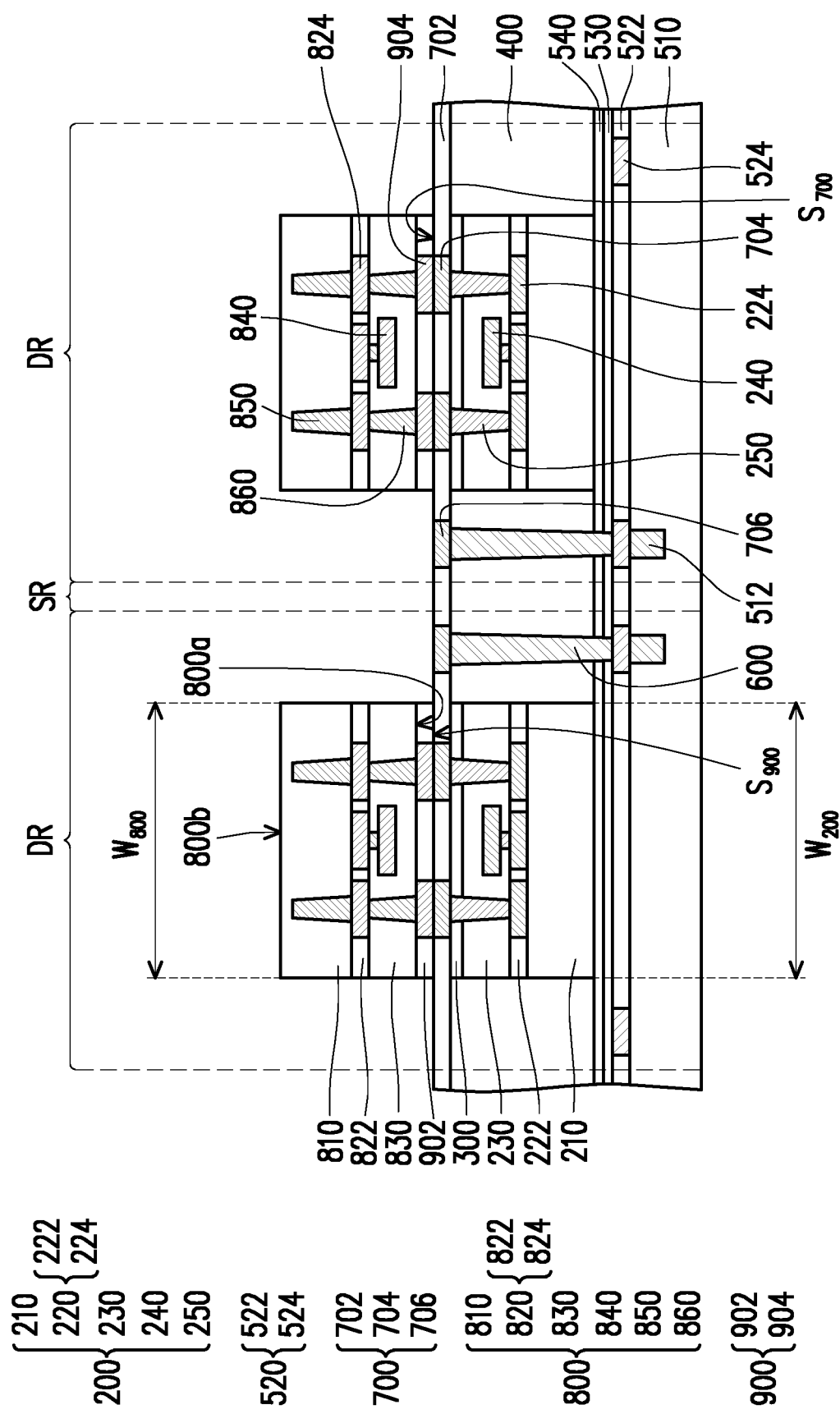
Figure 1J:
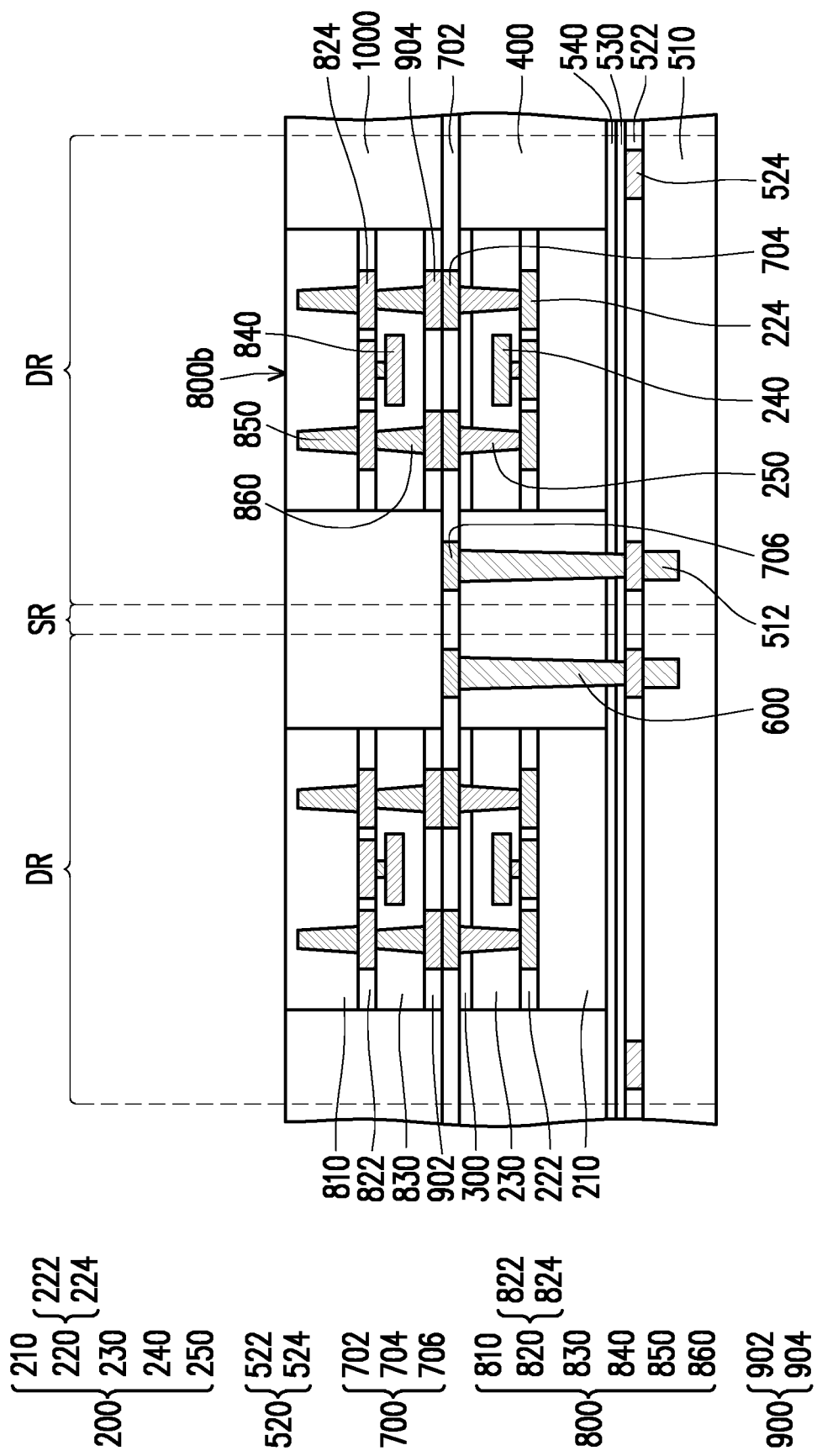
Figure 1K:
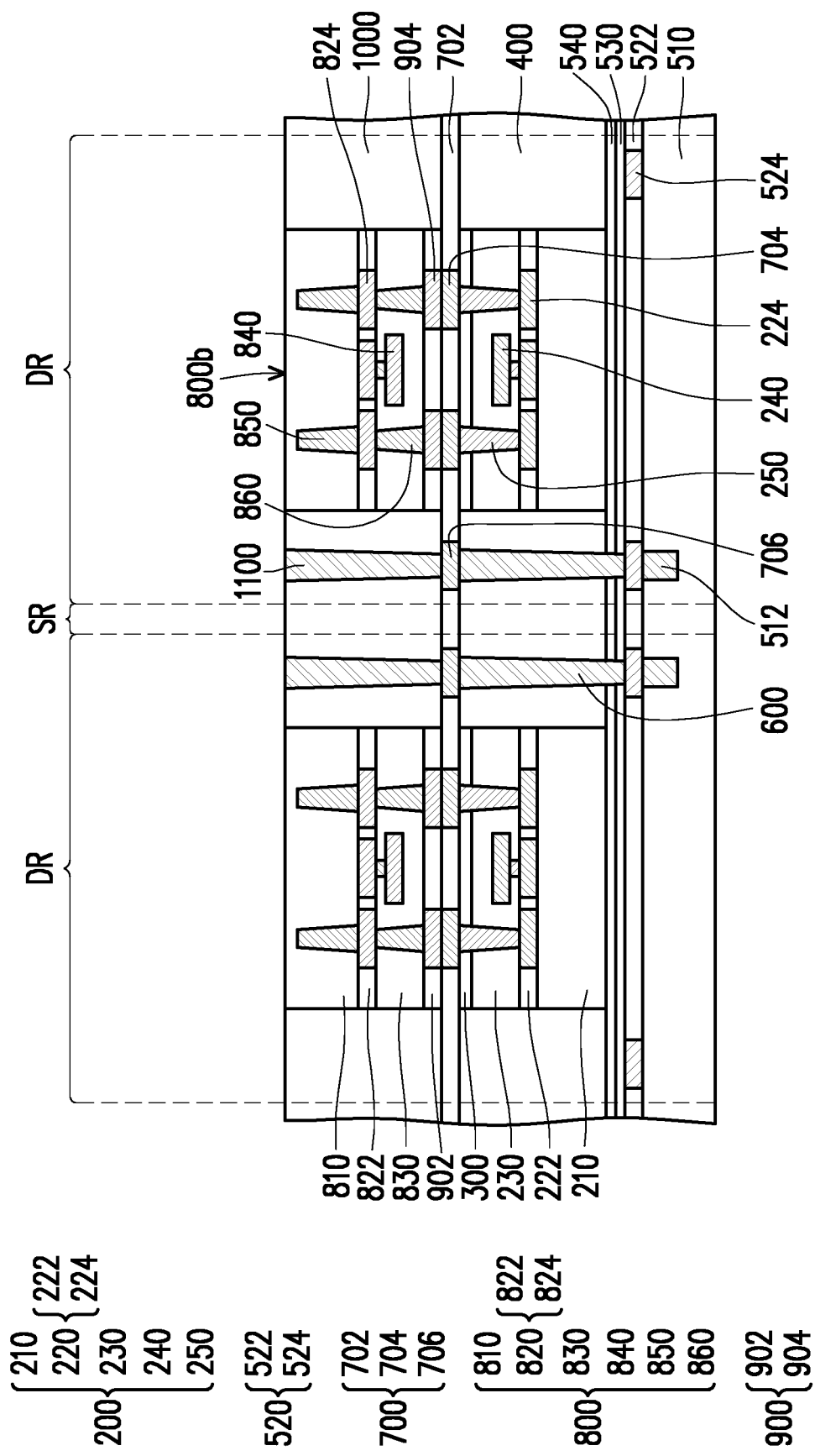
Figure 1L:
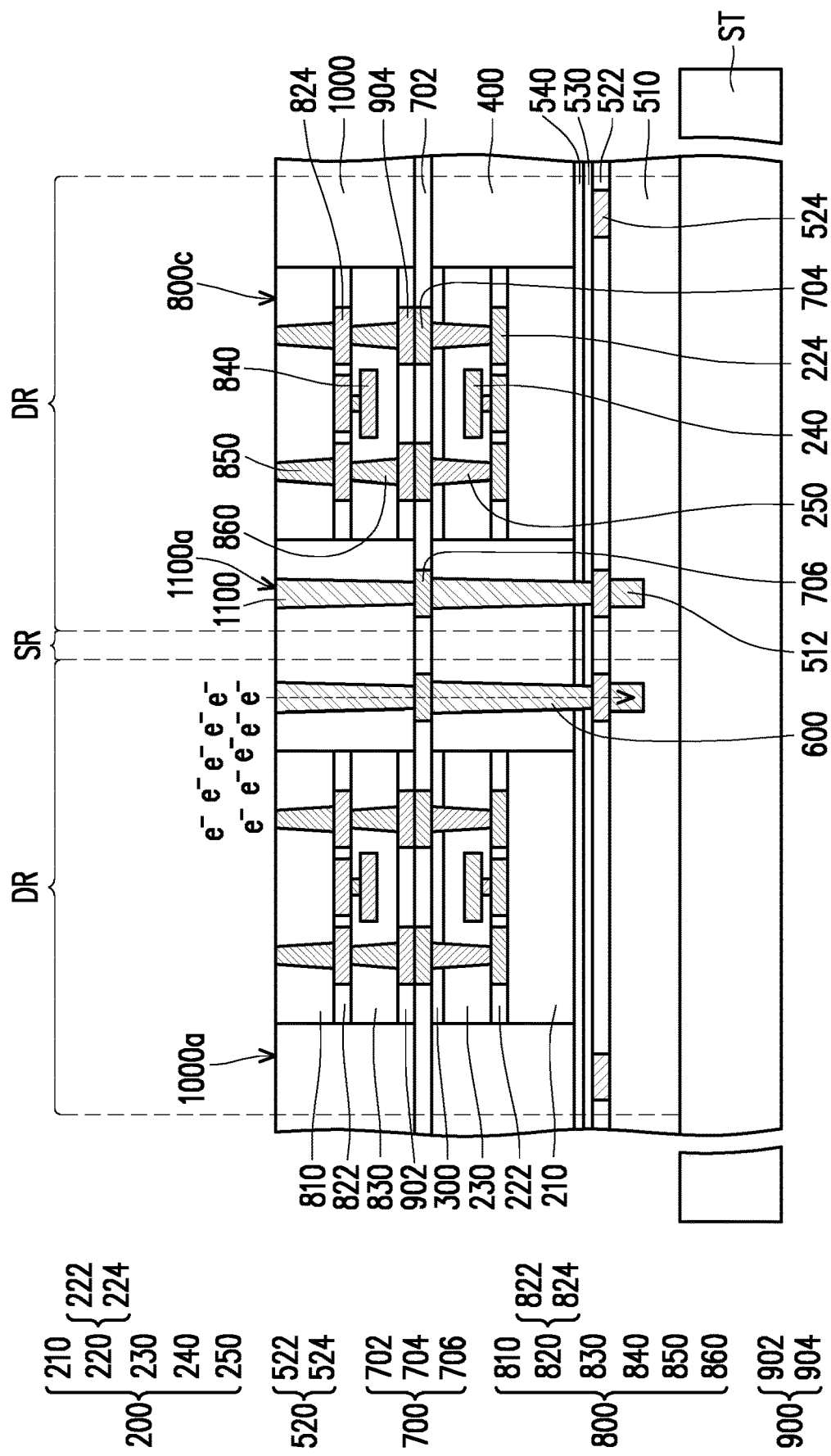
Figure 1M:
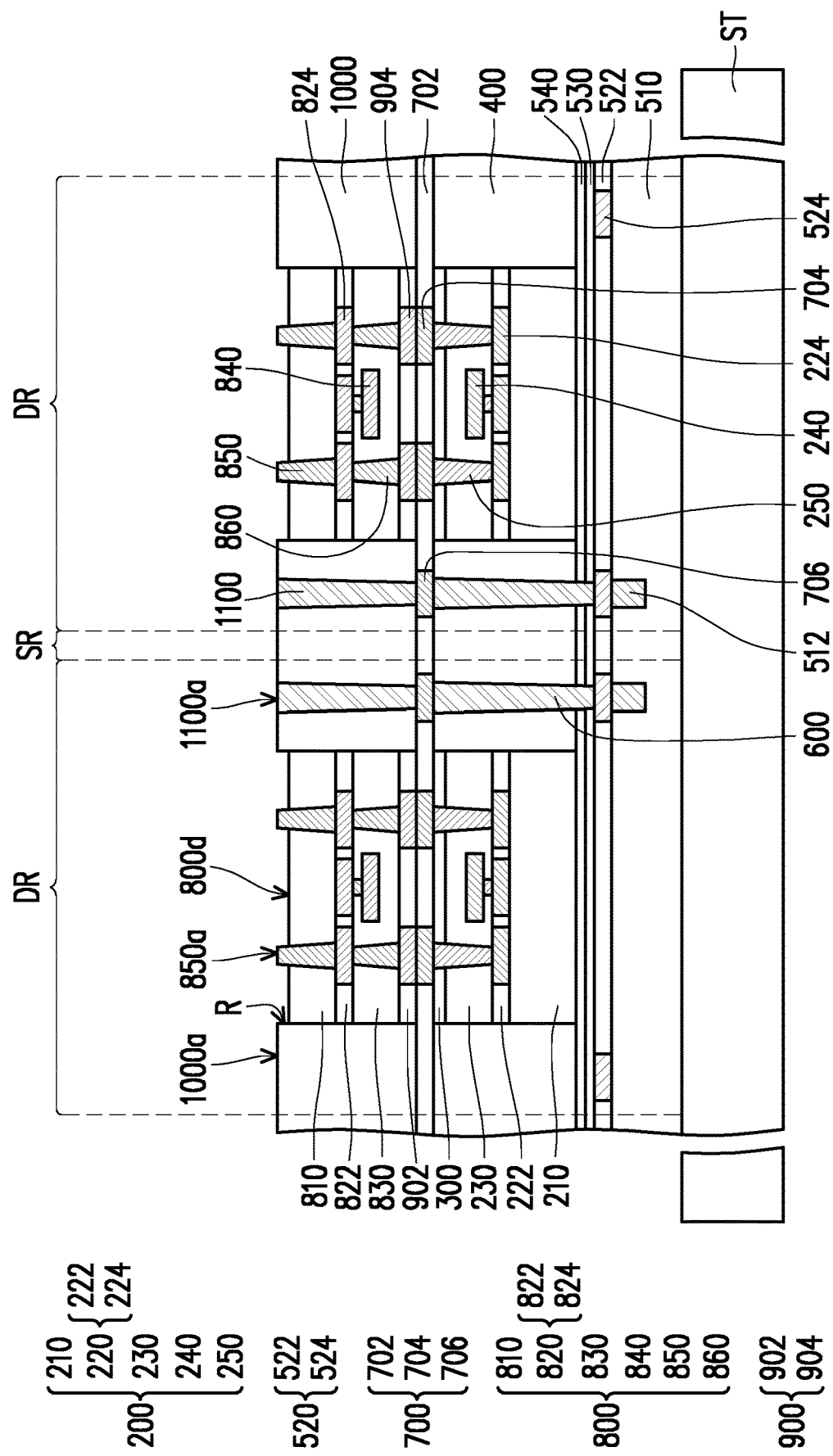
Figure 1N:
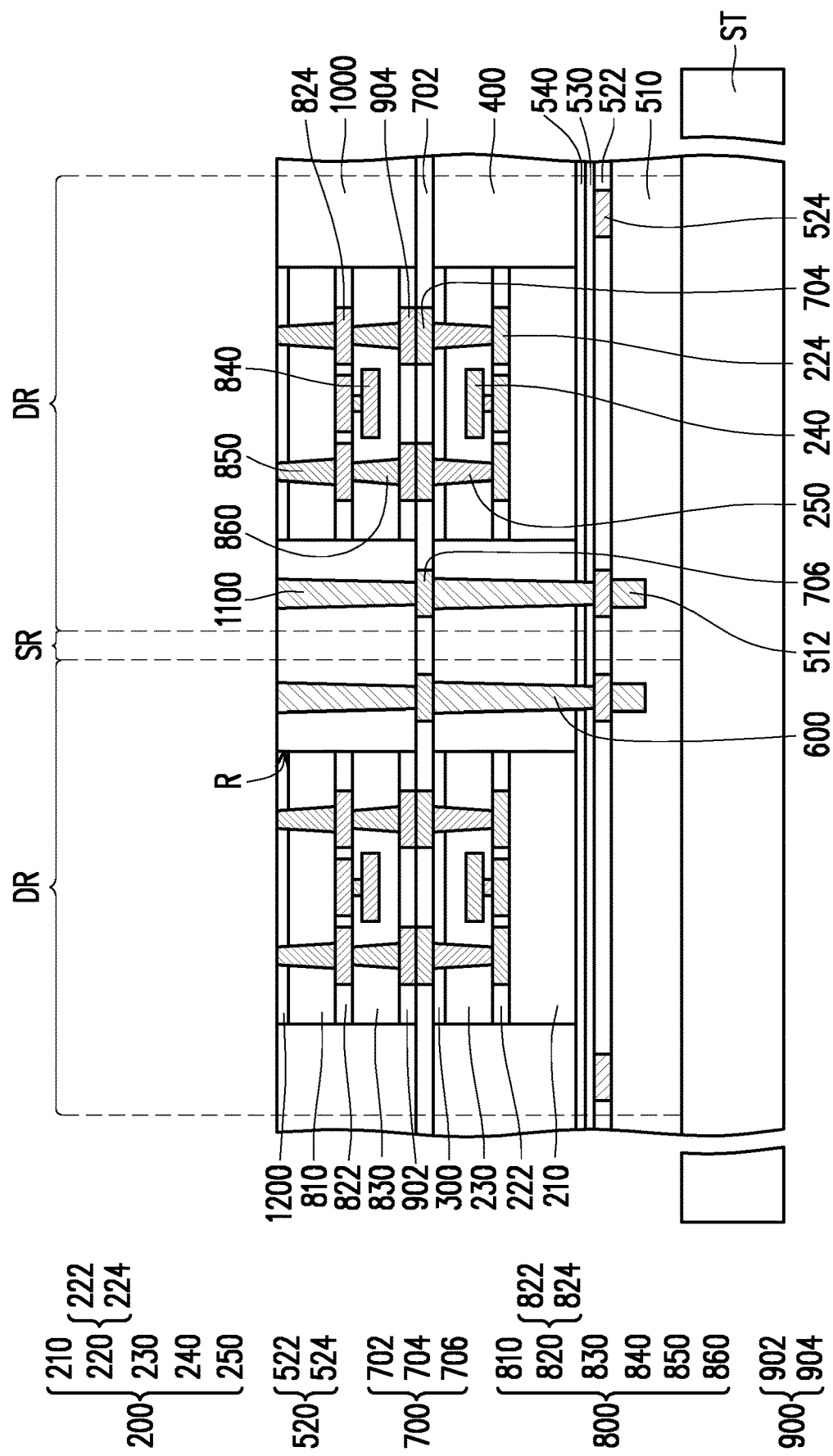
Figure 10:
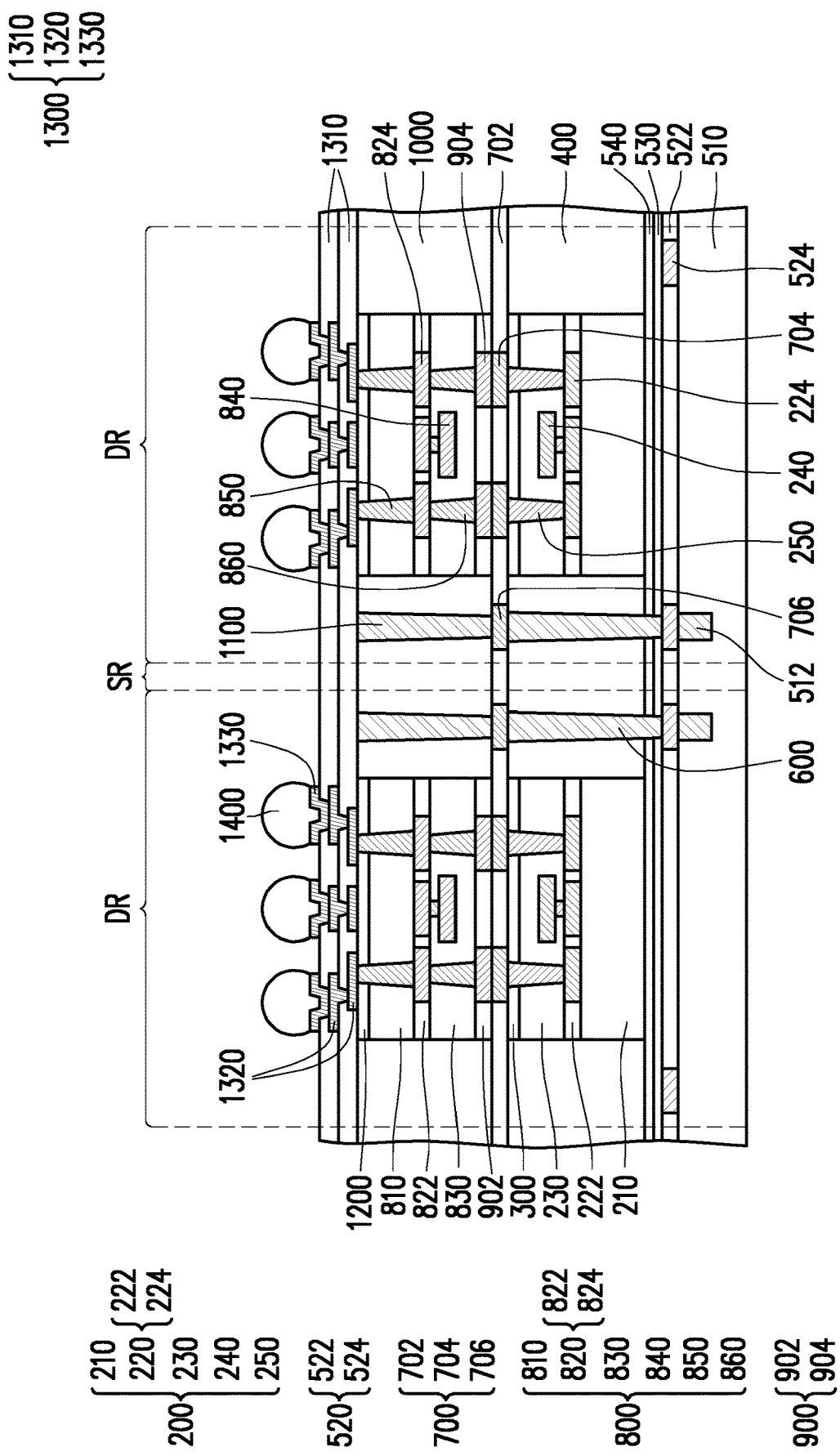
Figure 1P:
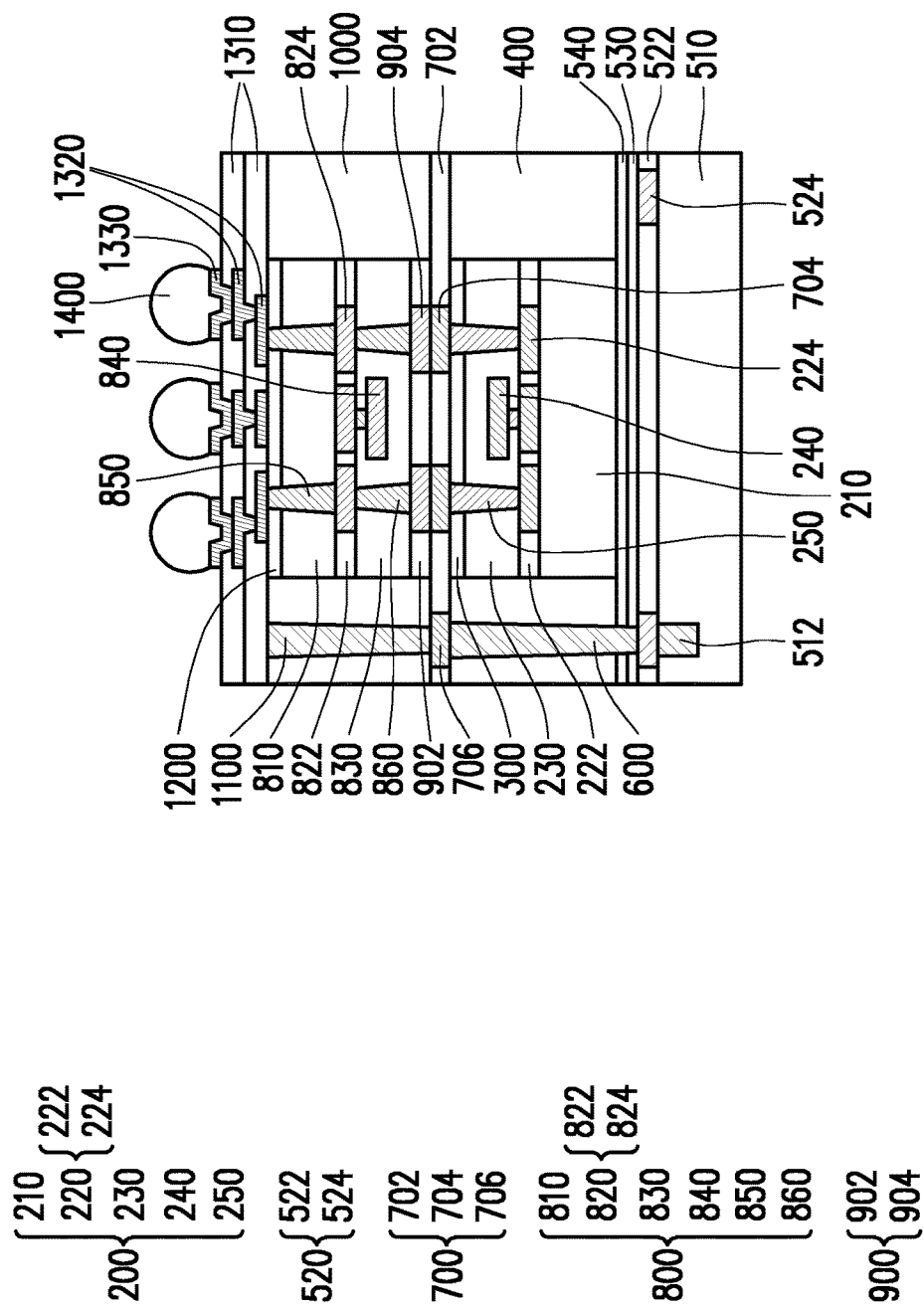

FIG. 1A to FIG. 1P are schematic cross-sectional views illustrating a manufacturing process of a package 10 in accordance with some embodiments of the disclosure. Referring to FIG. 1A, a carrier 110 is provided. In some embodiments, the carrier 110 includes semiconductor materials. For example, the carrier 110 may be made of a suitable elemental semiconductor, such as crystalline silicon, diamond, or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the carrier 110 is free of active components and passive components. In some embodiments, the carrier 110 is also free of wire routings. For example, the carrier 110 may be a blank substrate which purely functions as a supporting element without serving any signal transmission function.

As illustrated in FIG. 1A, a dielectric layer 120, an alignment layer 130, and a bonding layer 140 are sequentially disposed on the carrier 110. In other words, the alignment layer 130 is sandwiched between the dielectric layer 120 and the bonding layer 140. In some embodiments, the alignment layer 130 includes a dielectric layer 132 and a plurality of alignment marks 134 embedded in the dielectric layer 132. For example, the dielectric layer 132 surrounds the alignment marks 134. In some embodiments, the dielectric layer 120 and the dielectric layer 132 may be formed by suitable fabrication techniques, such as vapor deposition, spin coating, atomic layer deposition (ALD), thermal oxidation, some other suitable deposition or growth process, or a combination thereof. The vapor deposition may include, for example, chemical vapor deposition (CVD), physical vapor deposition (PVD), plasma enhanced chemical vapor deposition (PECVD), some other suitable vapor deposition process, or a combination thereof. In some embodiments, materials of the dielectric layer 120 and the dielectric layer 132 may be the same. For example, the dielectric layer 120 and the dielectric layer 132 may be polyimide, polybenzoxazole (PBO), benzocyclobutene (BCB), a nitride such as silicon nitride, an oxide such as silicon oxide, undoped silicate glass (USG), phosphosilicate glass (PSG), borosilicate glass (BSG), boron-doped phosphosilicate glass (BPSG), a combination thereof, or the like. However, the disclosure is not limited thereto. In some alternative embodiments, the material of the dielectric layer 120 may be different from the material of the dielectric layer 132. For example, the material of the dielectric layer 120 may include undoped silicate glass (USG) while the material of the dielectric layer 132 may include a nitride such as silicon nitride.

In some embodiments, the alignment marks 134 may be a patterned copper layer or other suitable patterned metal layer. In some embodiments, the alignment marks 134 may be formed by electroplating or deposition. It should be noted that the shapes and numbers of the alignment marks 134 are not limited in the disclosure, and may be designated based on the demand and/or design layout. In some embodiments, a top surface of the dielectric layer 132 is substantially levelled with top surfaces of the alignment marks 134. In some embodiments, the alignment marks 134 are electrically isolated from other components. In other words, the alignment marks 134 are electrically floating.

In some embodiments, the bonding layer 140 is a smooth layer having a continuous even surface and overlaid on the alignment layer 130. In some embodiments, a material of the bonding layer 140 may include silicon oxynitride (SiON), silicon oxide, silicon nitride, or the like. In some embodiments, the bonding layer 140 may be formed by deposition or the like. In some embodiments, the bonding layer 140 has a substantially uniform and even thickness.

Referring to FIG. 1B, a plurality of dies 200 are placed over the carrier 110. In some embodiments, each die 200 includes a semiconductor substrate 210, an interconnection structure 220, a passivation layer 230, and a conductive pad 240. In some embodiments, the interconnection structure 220 is disposed on the semiconductor substrate 210. The semiconductor substrate 210 may be made of a suitable elemental semiconductor, such as crystalline silicon, diamond, or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the semiconductor substrate 210 may include active components (e.g., transistors or the like) and/or passive components (e.g., resistors, capacitors, inductors, or the like) formed therein.

In some embodiments, the interconnection structure 220 includes an inter-dielectric layer 222 and a plurality of conductive patterns 224 embedded in the inter-dielectric layer 222. In some embodiments, the conductive patterns 224 of the interconnection structure 220 are electrically connected to the active components and/or the passive components embedded in the semiconductor substrate 210. In some embodiments, a material of the inter-dielectric layers 222 includes polyimide, epoxy resin, acrylic resin, phenol resin, BCB, PBO, combinations thereof, or other suitable dielectric materials. The inter-dielectric layers 222 may be formed by suitable fabrication techniques, such as spin-on coating, lamination, CVD, or the like. In some embodiments, a material of the conductive patterns 224 includes aluminum, titanium, copper, nickel, tungsten, and/or alloys thereof. The conductive patterns 224 may be formed by, for example, electroplating, deposition, and/or photolithography and etching. For simplicity, the interconnection structure 220 is illustrated as having one layer of inter-dielectric layer 222 and one layer of conductive patterns 224 in FIG. 1B. However, the disclosure is not limited thereto. In some alternative embodiments, the number of the layer of the inter-dielectric layer 222 and the number of the layer of the conductive patterns 224 may be adjusted depending on the routing requirements. For example, multiple layers of the inter-dielectric layer 222 and multiple layers of the conductive patterns 224 may be presented in the interconnection structure 220, and the conductive patterns 224 and the inter-dielectric layers 222 may be stacked alternately.

In some embodiments, the conductive pad 240 is disposed over the interconnection structure 220. In some embodiments, the conductive pad 240 is electrically connected to the conductive patterns 224 of the interconnection structure 220. In some embodiments, the conductive pad 240 may be aluminum pads, copper pads, or other suitable metal pads. It should be noted that the number and shape of the conductive pad 240 may be selected based on demand.

In some embodiments, the passivation layer 230 is formed over the interconnection structure 220 to seal the conductive pad 240. In some embodiments, a material of the passivation layer 230 includes oxides, such as silicon oxide or the like. Alternatively, the passivation layer 230 may include polyimide, epoxy resin, acrylic resin, phenol resin, BCB, PBO, or any other suitable polymer-based dielectric material. The passivation layer 230, for example, may be formed by suitable fabrication techniques, such as spin-on coating, CVD, PECVD, or the like.

In some embodiments, the dies 200 may be capable of performing logic functions. For example, the dies 200 may be Central Process Unit (CPU) dies, Graphic Process Unit (GPU) dies, Field-Programmable Gate Array (FPGA), or the like.

In some embodiments, each die 200 has an active surface 200a and a rear surface 200b opposite to the active surface 200a. In some embodiments, prior to the placement of the dies 200, a bonding layer 300 is formed on the active surface 200a of each die 200. For example, the bonding layer 300 is formed on the passivation layer 230 of the die 200. In some embodiments, the bonding layer 300 is a smooth layer having a continuous even surface. In some embodiments, a material of the bonding layer 300 may include silicon oxynitride (SiON), silicon oxide, silicon nitride, or the like. In some embodiments, the bonding layer 300 may be formed by deposition or the like.

In some embodiments, the dies 200 having the bonding layer 300 formed thereon are picked-and-placed onto the bonding layer 140 such that the bonding layer 300 is adhered to the bonding layer 140 through fusion bonding. The fusion bonding process may include a hydrophilic fusion bonding process, where a workable temperature is approximately greater than or substantially equal to about 100° C. and a workable pressure is approximately greater than or substantially equal to about 1 kg/cm$^2$. In some embodiments, the fusion bonding process does not involve metal to metal bonding. As illustrated in FIG. 1B, the dies 200 are bonded to the carrier 110 in a face down manner. That is, the active surfaces 200a of the dies 200 face the carrier 110. In some embodiments, the dies 200 are arranged in an array. In some embodiments, with the aid of the alignment marks 143, the placement precision of the dies 200 may be effectively enhanced.

Referring to FIG. 1C, an encapsulant material 400' is formed over the bonding layer 140 to conformally cover the dies 200. In some embodiments, the encapsulant material 400' includes a molding compound, a polymeric material, such as polyimide, epoxy resin, acrylic resin, phenol resin, BCB, PBO, a combination thereof, or other suitable polymer-based dielectric materials. In some alternative embodiments, the encapsulant material 400' may include silicon oxide and/or silicon nitride. In some embodiments, the encapsulant material 400' further includes fillers. Alternatively, the encapsulant material 400' may be free of fillers. In some embodiments, the encapsulant material 400' may be formed by a molding process (such as a compression molding process), a spin-coating process, a CVD process, a PECVD process, an ALD process, or the like. As illustrated in FIG. 1C, the dies 200 are not revealed and are well protected by the encapsulant material 400'.

Referring to FIG. 1C and FIG. 1D, the encapsulant material 400' is thinned to form an encapsulant 400. That is, the encapsulant material 400' is thinned until the semiconductor substrates 210 of the dies 200 are exposed. In some embodiments, after the semiconductor substrates 210 are revealed, the semiconductor substrates 210 and the encapsulant 400 may be further thinned to reduce the overall thickness of the dies 200. In some embodiments, the encapsulant material 400' and the semiconductor substrates 210 may be thinned or planarized through a grinding process, such as a mechanical grinding process, a chemical mechanical polishing (CMP) process, or the like. In some embodiments, the encapsulant 400 laterally encapsulates the dies 200 and the bonding layer 300. That is, rear surfaces 200b of the dies 200 are substantially coplanar with a top surface of the encapsulant 400. In some embodiments, the encapsulant 400 covers sidewalls of the dies 200 and sidewalls of the bonding layer 300. In some embodiments, the encapsulant 400 may be referred to as "gap fill oxide."

Referring to FIG. 1E, the dies 200 and the encapsulant 400 are attached to a semiconductor carrier 510. For example, a bonding layer 540, a dielectric layer 530, an alignment layer 520, and the semiconductor carrier 510 are sequentially formed on the rear surfaces 200b of the dies 200 and the encapsulant 400. In some embodiments, the bonding layer 540 is a smooth layer having a continuous even surface and overlaid on the dies 200 and the encapsulant 400. In some embodiments, a material of the bonding layer 540 may include silicon oxynitride (SiON), silicon oxide, silicon nitride, or the like. In some embodiments, the bonding layer 540 may be formed by deposition or the like. In some embodiments, the bonding layer 540 has a substantially uniform and even thickness.

In some embodiments, the dielectric layer 530 is located between the alignment layer 520 and the encapsulant 400. For example, the dielectric layer 530 is sandwiched between the alignment layer 520 and the bonding layer 540. In some embodiments, the dielectric layer 530 may be formed by suitable fabrication techniques, such as vapor deposition, spin coating, ALD, thermal oxidation, some other suitable deposition or growth process, or a combination thereof. The vapor deposition may include, for example, CVD, PVD, PECVD, some other suitable vapor deposition process, or a combination thereof. In some embodiments, the dielectric layer 530 may be polyimide, PBO, BCB, a nitride such as silicon nitride, an oxide such as silicon oxide, USG, PSG, BSG, BPSG, a combination thereof, or the like.

As illustrated in FIG. 1E, the alignment layer 520 is located between the semiconductor carrier 510 and the dies 200 and between the semiconductor carrier 510 and the encapsulant 400. In some embodiment, the alignment layer 520 includes a dielectric layer 522 and a plurality of alignment marks 524 embedded in the dielectric layer 522. For example, the dielectric layer 522 surrounds the alignment marks 524. The dielectric layer 522 and the alignment marks 524 of the alignment layer 520 are respectively slimier to the dielectric layer 132 and the alignment marks 134 of the alignment layer 130, so the detailed descriptions thereof are omitted herein. In some embodiments, a top surface of the dielectric layer 522 is substantially levelled with top surfaces of the alignment marks 524. Similarly, a bottom surface of the dielectric layer 522 is also substantially levelled with bottom surfaces of the alignment marks 524.

In some embodiments, the semiconductor substrate 510 is disposed on the alignment layer 520. In some embodiments, the semiconductor carrier 510 may be made of a suitable elemental semiconductor, such as crystalline silicon, diamond, or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the semiconductor carrier 510 is free of active components and passive components. In some embodiments, the semiconductor carrier 510 has a plurality of die regions DR and a plurality of scribe line regions SR. Each scribe lien region SR is located between two adjacent die regions DR. For simplicity, two die regions DR and one scribe line region SR is illustrated in FIG. 1E. In some embodiments, with the aid of the alignment marks 134 and the alignment marks 254, the bonding precision of the semiconductor substrate 510 may be effectively enhanced.

In some embodiments, a plurality of contact vias 512 are embedded in the semiconductor carrier 510. In some embodiments, the contact vias 512 are made of metal. For example, the contact vias 512 may include aluminum, titanium, copper, nickel, tungsten, and/or alloys thereof. As illustrated in FIG. 1E, the contact vias 512 are located in the die regions DR. In some embodiments, bottom surfaces of the contact vias 512 are coplanar with a bottom surface of the semiconductor carrier 510. However, the disclosure is not limited thereto. In some alternative embodiments, a bonding layer (not shown) may optionally exist between the semiconductor carrier 510 and the alignment layer 520 to further enhance the bonding between these two elements. When such bonding layer exists, the contact vias 512 penetrate through the bonding layer. That is, bottom surfaces of the contact vias 512 are coplanar with a bottom surface of the bonding layer. In some embodiments, the contact vias 512 are electrically grounded. For example, the contact vias 512 are electrically connected to a ground voltage. In some embodiments, the contact vias 512 are directly in contact with the semiconductor carrier 510. For example, sidewalls and top surfaces of the contact vias 512 are directly in contact with the semiconductor carrier 510.

As illustrated in FIG. 1E, the bottom surfaces of the contact vias 512 are directly in contact with some of the alignment marks 524. In some embodiments, some of the alignment marks 524 are electrically connected to the contact vias 512. For example, some of the alignment marks 524 are electrically grounded through the contact vias 512. On the other hand, the rest of the alignment marks 524 are electrically floating. In some embodiments, the alignment marks 524 and the dies 200 are also located within the die regions DR.

Referring to FIG. 1E and FIG. 1F, the carrier 110, the dielectric layer 120, the alignment layer 130, and the bonding layer 140 are removed from the encapsulant 400 and the bonding layer 300. For example, as illustrated in FIG. 1F, the encapsulant 400 and the bonding layer 300 are exposed. In some embodiments, the carrier 110, the dielectric layer 120, the alignment layer 130, and the bonding layer 140 are removed through a planarization process, an etching process, a stripping process, the like, or a combination thereof. After removal of these layers, the structure is flipped upside down such that the dies 200 are disposed over the semiconductor substrate 510.

Referring to FIG. 1G, a plurality of through insulating vias (TIV) 600 are formed in the encapsulant 400, the bonding layer 540, and the dielectric layer 530. In some embodiments, the TIVs 600 are formed aside the dies 200. In some embodiments, the TIVs 600 penetrate through the encapsulant 400, the bonding layer 540, and the dielectric layer 530 to be in direct contact with some of the alignment marks 524. That is, some of the alignment marks 524 are located between the TIVs 600 and the contact vias 512. In some embodiments, the TIVs 600 are electrically connected to the alignment marks 524 and the contact vias 512. In other words, the TIVs 600 are electrically grounded through the alignment marks 524 and the contact vias 512. In some embodiments, a material of the TIVs 600 includes aluminum, titanium, copper, nickel, tungsten, and/or alloys thereof. In some embodiments, the TIVs 600 may be formed by the following steps. First, a laser drilling or an etching process is performed on the encapsulant 400, the bonding layer 540, and the dielectric layer 530 to form a plurality of openings (not shown). The openings expose at least a portion of some of the alignment marks 524. Thereafter, a plating process is performed to fill the openings, so as to form the TIVs 600.

Referring to FIG. 1H, a plurality of bonding vias 250 and a bonding layer 700 are formed. In some embodiments, the bonding vias 250 are formed to penetrate through the bonding layers 300 and the passivation layers 230 of the dies 200 to establish electrical connection with the conductive patterns 224 of the interconnection structures 220. The bonding layer 700 is formed over the dies 200, the bonding layer 300, the encapsulant 400, and the TIVs 600. In some embodiments, the bonding layer 700 is formed over the dies 200 opposite to the bonding layer 540. In some embodiments, the bonding layer 700 includes a dielectric layer 702, a plurality of bonding pads 704, and a plurality of connecting pads 706. In some embodiments, the bonding pads 704 and the connecting pads 706 are embedded in the dielectric layer 702. In some embodiments, the bonding pads 704 are formed on the bonding vias 250 while the connecting pads 706 are formed on the TIVs 600. That is, the bonding pads 704 are connected to the bonding vias 250 and the connecting pads 706 are connected to the TIVs 600. For example, the connecting pads 706 are electrically grounded through the TIVs 600, the alignment marks 524, and the contact vias 512. On the other hand, the bonding vias 250 electrically connect the interconnection structure 220 and the bonding pads 704.

In some embodiments, the bonding vias 250 and the bonding pads 704 may be formed via a dual damascene process. For example, the dielectric layer 702 is first formed on the bonding layer 300, the encapsulant 400, and the TIVs 600. In some embodiments, a material of the dielectric layer 702 includes oxides, such as silicon oxide or the like. Alternatively, the dielectric layer 702 may include polyimide, epoxy resin, acrylic resin, phenol resin, BCB, PBO, or any other suitable polymer-based dielectric material. The dielectric layer 702, for example, may be formed by suitable fabrication techniques, such as spin-on coating, CVD, PECVD, or the like. Subsequently, trenches (not shown) are formed in the dielectric layer 702 and via holes (not shown) are formed in the bonding layers 300 and the passivation layers 230 by removing portions of theses layers. In some embodiments, a width of the trench is greater than a width of the via hole. Thereafter, a conductive material (not shown) is filled into the trenches and the via holes to form the bonding pads 704 and the bonding vias 250, respectively. In some embodiments, the bonding vias 250 and the bonding pads 704 are formed by simultaneously filling via holes and overlying trenches (not shown). In some alternative embodiments, the bonding vias 250 may be formed before the bonding layer 700. In some embodiments, a width of each bonding pad 704 may be greater than a width of each underlying bonding via 250. In some embodiments, the bonding vias 250 and the bonding pads 704 include the same material. Materials for the bonding vias 250 and the bonding pads 704 are, for example, aluminum, titanium, copper, nickel, tungsten, or alloys thereof. In some embodiments, the bonding vias 250 may be considered as part of the dies 200.

In some embodiments, the bonding pads 704 and the connecting pads 706 include the same material. For example, the connecting pads 706 may be made of aluminum, titanium, copper, nickel, tungsten, or alloys thereof. In some embodiments, the bonding pads 704 and the connecting pads 706 may be simultaneously formed.

In some embodiments, a top surface of the dielectric layer 702, top surfaces of the bonding pads 704, and top surfaces of the connecting pads 706 may be collectively referred to as a bonding surface $S_{700}$. As shown in FIG. 1H, the top surface of the dielectric layer 702, the top surfaces of the bonding pads 704, and the top surfaces of the connecting pads 706 are substantially located at the same level height to provide an appropriate bonding surface $S_{700}$ for hybrid bonding.

Referring to FIG. 1I, a plurality of dies 800 are stacked over the dies 200. In some embodiments, each die 800 includes a semiconductor substrate 810, an interconnection structure 820, a passivation layer 830, a conductive pad 840, a plurality of through semiconductor vias (TSV) 850, and a plurality of bonding vias 860. In some embodiments, the semiconductor substrate 810 in FIG. 1I is similar to the semiconductor substrate 210 in FIG. 1B, so the detailed description thereof is omitted herein. As illustrated in FIG. 1I, the interconnection structure 820 is disposed on the semiconductor substrate 810. In some embodiments, the interconnection structure 820 includes an inter-dielectric layer 822 and a plurality of conductive patterns 824. The inter-dielectric layer 822 and the conductive patterns 824 of the interconnection structure 820 are respectively similar to the inter-dielectric layer 222 and the conductive patterns 224 of the interconnection structure 220, so the detailed descriptions thereof are omitted herein.

In some embodiments, the conductive pad 840 is disposed over and electrically connected to the interconnection structure 820. On the other hand, the passivation layer 830 is formed over the interconnection structure 820 to seal the conductive pads 840. The passivation layer 830 and the conductive pad 840 of the die 800 are respectively similar to the passivation layer 230 and the conductive pad 240 of the die 200, so the detailed descriptions thereof are omitted herein. As illustrated in FIG. 1I, the TSVs 850 are embedded in the semiconductor substrate 810. In some embodiments, a material of the TSVs 850 may include aluminum, titanium, copper, nickel, tungsten, or alloys thereof. In some embodiments, the TSVs 850 are directly in contact with the conductive patterns 824 to render electrical connection with the interconnection structure 820.

In some embodiments, the bonding vias 860 penetrate through the passivation layer 830 to establish electrical connection with the conductive patterns 824 of the interconnection structure 820. In some embodiments, a material of the bonding vias 860 may include aluminum, titanium, copper, nickel, tungsten, or alloys thereof. In some embodiments, the bonding vias 860 may be formed by a plating process or the like.

In some embodiments, the dies 800 may be capable of performing storage functions. For example, the dies 800 may be Dynamic Random Access Memory (DRAM), Resistive Random Access Memory (RRAM), Static Random Access Memory (SRAM), or the like. However, the disclosure is not limited thereto. In some alternative embodiments, the dies 800 may be Central Process Unit (CPU) dies, Graphic Process Unit (GPU) dies, Field-Programmable Gate Array (FPGA), or the like.

In some embodiments, a size of each die 800 may be substantially the same as a size of the corresponding die 200. For example, a width $W_{800}$ of each die 800 may be substantially equal to a width $W_{200}$ of each die 200. In some embodiments, each die 800 has an active surface 800a and a rear surface 800b opposite to the active surface 800a. In some embodiments, prior to the placement of the dies 800, a bonding layer 900 is formed on the active surface 800a of each die 800. For example, the bonding layer 900 is formed on the passivation layer 830 and the bonding vias 860 of the die 800. In some embodiments, the bonding layer 900 includes a dielectric layer 902 and a plurality of bonding pads 904 embedded in the dielectric layer 902. In some embodiments, the bonding pads 904 of the bonding layer 900 are electrically connected to the bonding vias 860. That is, the bonding vias 860 electrically connect the interconnection structure 820 and the bonding pads 904 of the bonding layer 900. The dielectric layer 902 and the bonding pads 904 in FIG. 1I are respectively similar to the dielectric layer 702 and the bonding pads 704 in FIG. 1H, so the detailed descriptions thereof are omitted herein.

In some embodiments, a bottom surface of the dielectric layer 902 and bottom surfaces of the bonding pads 904 may be collectively referred to as a bonding surface $S_{900}$. As shown in FIG. 1I, the bottom surface of the dielectric layer 902 and the bottom surfaces of the bonding pads 904 are substantially located at the same level height to provide an appropriate bonding surface $S_{900}$ for hybrid bonding.

As illustrated in FIG. 1I, the dies 800 are individually placed over the corresponding dies 200 such that each die 800 is bonded to the corresponding die 200 through the bonding layers 700 and 900. For example, the bonding layers 900 are sandwiched between the bonding layer 700 and the dies 800. In some embodiments, the bonding layer 700 is bonded to the bonding layer 900 through a hybrid bonding process. In some embodiments, a temperature of the hybrid bonding process ranges from about 150° C. to about 400° C. The hybrid bonding process will be described in detail below.

In some embodiments, the dies 800 having the bonding layer 900 formed thereon may be picked-and-placed onto the bonding surface $S_{700}$ of the bonding layer 700 such that the dies 800 are electrically connected to the dies 200. In some embodiments, the bonding surface $S_{900}$ of the bonding layer 900 is in contact with the bonding surface $S_{700}$ of the bonding layer 700. For example, the bonding pads 904 of the bonding layer 900 are substantially aligned and in direct contact with the corresponding bonding pads 704 of the bonding layer 700. In some embodiments, to facilitate the hybrid bonding between the bonding layer 700 and the bonding layer 900, surface preparation for bonding surfaces (i.e. the bonding surface $S_{700}$ and the bonding surface $S_{900}$) of the bonding layer 700 and the bonding layer 900 may be performed. The surface preparation may include surface cleaning and activation, for example. Surface cleaning may be performed on the bonding surfaces $S_{700}$ and $S_{900}$ to remove particles on the bonding surface of the dielectric layer 702, the bonding surfaces of the bonding pads 704, the bonding surface of the dielectric layer 902, and the bonding surfaces of the bonding pads 904. In some embodiments, the bonding surfaces $S700$ and $S_{900}$ may be cleaned by wet cleaning, for example. Not only particles are removed, but also native oxide formed on the bonding surfaces of the bonding pads 704 and the bonding pads 904 may be removed. The native oxide formed on the bonding surfaces of the bonding pads 704 and the bonding pads 904 may be removed by chemicals used in wet cleaning processes, for example.

After cleaning the bonding surface $S_{700}$ of the bonding layer 700 and the bonding surface $S_{900}$ of the bonding surface 900, activation of the bonding surfaces of the dielectric layer 702 and the dielectric layer 902 may be performed for development of high bonding strength. In some embodiments, plasma activation may be performed to treat the bonding surfaces of the dielectric layer 702 and the dielectric layer 902. When the activated bonding surface of the dielectric layer 702 is in contact with the activated bonding surface of the dielectric layer 902, the dielectric layer 702 of the bonding layer 700 and the dielectric layer 902 of the bonding layer 900 are pre-bonded.

After pre-bonding the bonding layer 900 onto the bonding layer 700, hybrid bonding of the bonding layer 700 and the bonding layer 900 are performed. The hybrid bonding of the bonding layer 700 and the bonding layer 900 may include a thermal treatment for dielectric bonding and a thermal annealing for conductor bonding. In some embodiments, the thermal treatment for dielectric bonding is performed to strengthen the bonding between the dielectric layer 702 and the dielectric layer 902. For example, the thermal treatment for dielectric bonding may be performed at temperature ranging from about 200° C. to about 400° C. After performing the thermal treatment for dielectric bonding, the thermal annealing for conductor bonding is performed to facilitate the bonding between the bonding pads 704 and the bonding pads 904. For example, the thermal annealing for conductor bonding may be performed at temperature ranging from about 150° C. to about 400° C. After performing the thermal annealing for conductor bonding, the dielectric layer 702 is hybrid bonded to the dielectric layer 902 and the bonding pads 704 are hybrid bonded to the bonding pads 904. For example, the dielectric layer 702 is directly in contact with the dielectric layer 902. Similarly, the bonding pads 704 are directly in contact with the bonding pads 904. As such, the bonding layer 700 is hybrid bonded to the bonding layer 900. Although FIG. 1I illustrated that the bonding pads 704 and the bonding pads 904 have sharp corners (the sidewalls are perpendicular to the top/bottom surfaces), the disclosure is not limited thereto. In some alternative embodiments, after the bonding pads 704 are hybrid bonded to the bonding pads 904, corner rounding of the bonding pads may occur. For example, the corners of the bonding pads 704 facing the bonding pads 904 are rounded. Similarly, the corners of the bonding pads 904 facing the bonding pads 704 are also rounded. That is, edges of the top surface of each bonding pad 704 are rounded. Similarly, edges of the bottom surface of each bonding pad 904 are also rounded. Moreover, although FIG. 1I illustrated that the bonding pads 704 and the bonding pads 904 have the same width and sidewalls of the bonding pads 704 are aligned with sidewalls of the bonding pads 904, the disclosure is not limited thereto. In some alternative embodiments, the width of each bonding pad 704 may be smaller than or larger than the width of each bonding pad 904.

In some embodiments, since the structure in FIG. 1H is in wafer form and the dies 800 having the bonding layer 900 formed thereon are in chip form, the hybrid bonding process in FIG. 1I may be referred to as a "chip-on-wafer bonding process."

Referring to FIG. 1J, an encapsulant 1000 is formed over the bonding layer 700 to laterally encapsulate the dies 800 and the bonding layer 900. That is, rear surfaces 800b of the dies 800 are substantially coplanar with a top surface of the encapsulant 1000 and the encapsulant 1000 covers sidewalls of the dies 800 and the bonding layers 900. In some embodiments, the encapsulant 1000 may be referred to as "gap fill oxide." In some embodiments, a material and a formation method of the encapsulant 1000 in FIG. 1J is similar to the encapsulant 400 in FIG. 1D, so the detailed descriptions thereof is omitted herein.

Referring to FIG. 1K, a plurality of TIVs 1100 are formed in the encapsulant 1000. In some embodiments, the TIVs 1100 are formed aside the dies 800. In some embodiments, the TIVs 1100 penetrate through the encapsulant 1000 to be in direct contact with the connecting pads 706. In some embodiments, the TIVs 1100 are electrically connected to the connecting pads 706. In other words, the TIVs 1100 are electrically grounded through the connecting pads 706, the TIVs 600, the alignment marks 524, and the contact vias 512. As illustrated in FIG. 1K, the TIVs 1100 are substantially aligned with the TIVs 600. In some embodiments, a material of the TIVs 1100 includes aluminum, titanium, copper, nickel, tungsten, and/or alloys thereof. In some embodiments, the TIVs 1100 may be formed by the following steps. First, a laser drilling or an etching process is performed on the encapsulant 1000 to form a plurality of openings (not shown). The openings expose at least a portion of each connecting pad 706. Thereafter, a plating process may be performed to fill the openings, so as to form the TIVs 1100.

Referring to FIG. 1K and FIG. 1L, the structure illustrated in FIG. 1K is placed on a thinning stage ST. In some embodiment, the thinning stage ST may be electrically connected to a ground. Subsequently, the dies 800, the encapsulant 1000, and the TIVs 1100 are thinned until the TSVs 850 of the dies 800 are exposed. That is, the dies 800 are thinned from the rear surfaces 800b. In some embodiments, the dies 800, the encapsulant 1000, and the TIVs 1100 may be thinned or planarized through a grinding process, such as a mechanical grinding process, a CMP process, or the like. In some embodiments, after the TSVs 850 are exposed, the dies 800, the encapsulant 1000, and the TIVs 1100 may be further thinned to reduce the overall thickness of the dies 800. After the thinning process, rear surfaces 800c of the dies 800 are substantially coplanar with a top surface 1000a of the encapsulant 1000 and top surfaces 1100a of the TIVs 1100. As illustrated in FIG. 1L, after the thinning process, the TSVs 850 penetrate through the semiconductor substrates 810 of the dies 800.

In some embodiments, during the thinning process, electrons may be generated and accumulated at the grinding surface (i.e. the rear surfaces 800c of the dies 800, the top surface 1000a of the encapsulant 1000, and the top surfaces 1100a of the TIVs 1100). The accumulation of the electron would cause corrosion issues to the TSVs 850 and the TIVs 1100. Nevertheless, since the TIVs 1100 are electrically grounded, the TIVs 1100 are able to create a path to deplete the accumulated electrons. In other words, the accumulated electron would be pulled down and travels sequentially through the TIVs 1100, the connecting pads 706, the TIVs 600, and the alignment marks 524 to arrive at the contact vias 512, as illustrated in FIG. 1L. The electrons in the contact vias 512 may be further transfer out of the structure. As such, the issue of corrosion derived from electron accumulation may be resolved.

Referring to FIG. 1M, a portion of each die 800 is removed to form a plurality of recesses R. For example, a portion of the semiconductor substrate 810 of each die 800 is removed to form the recess R. As illustrated in FIG. 1M, the TSVs 850 are partially located in the recesses R. In some embodiments, at least a portion of each TSV 850 protrudes from the semiconductor substrates 810 of the dies 800. That is, top surfaces 850a of the TSVs 850, the top surface 1000a of the encapsulant 1000, and the top surfaces 1100a of the TIVs 1100 are located at a level height higher than rear surfaces 800d of the dies 800. In some embodiments, the semiconductor substrates 810 may be partially removed through an etching process. The etching process includes, for example, an isotropic etching process and/or an anisotropic etching process. For example, the semiconductor substrates 810 may be partially removed through a wet etching process, a drying etching process, or a combination thereof.

Referring to FIG. 1N, a protection layer 1200 is formed to fill the recesses R. In some embodiments, the protection layer 1200 includes a molding compound, a molding underfill, or the like. Alternatively, the protection layer 1200 may be made of a polymeric material, such as polyimide, epoxy resin, acrylic resin, phenol resin, BCB, PBO, or other suitable polymer-based dielectric materials. In some embodiments, the protection layer 1200 may include fillers. Alternatively, the protection layer 1200 may be free of fillers. As illustrated in FIG. 1N, the protruding portion of each TSV 850 is laterally encapsulated by the protection layer 1200. In some embodiments, the protection layer 1200 may be formed by the following steps. First, a protection material layer (not shown) is formed in the recesses R and over the encapsulant 1000 and the TIVs 1100. Subsequently, a grinding or thinning process is performed on the protection material layer until the TSVs 850 and the TIVs 1100 are revealed. The thinning process includes, for example, a mechanical grinding process, a CMP process, or the like. Similar to the process shown in FIG. 1L, during the thinning process, electrons may be generated and accumulated at the grinding surface. Again, the electrically grounded TIVs 1100 are able to create a path to deplete the accumulated electrons, so as to resolve the issue of corrosion derived from electron accumulation.

Referring to FIG. 1N and FIG. 1O, the structure is detached from the thinning stage ST. Thereafter, a redistribution structure 1300 and a plurality of conductive terminals 1400 are sequentially formed over the dies 800, the encapsulant 1000, the protection layer 1200, and the TIVs 1100. In some embodiments, the redistribution structure 1300 includes a plurality of dielectric layers 1310 and a plurality of redistribution conductive layers 1320. The redistribution conductive layers 1320 may include a plurality of redistribution conductive patterns. In some embodiments, each redistribution conductive layer 1320 is sandwiched between two adjacent dielectric layers 1310. Portions of the redistribution conductive layers 1320 may extend vertically within the dielectric layer 1310 to establish electrical connection with other overlying or underlying redistribution conductive layers 1320. In some embodiments, a material of the redistribution conductive layers 1320 includes aluminum, titanium, copper, nickel, tungsten, combinations thereof, or other suitable conductive materials. For example, the bottommost redistribution conductive layer 1320 may include a plurality of copper traces while the topmost redistribution conductive layer 1320 may include a plurality of aluminum pads. However, the disclosure is not limited thereto. The redistribution conductive layers 1320 may be formed by, for example, electroplating, deposition, and/or photolithography and etching. In some embodiments, a material of the dielectric layer 1310 includes polyimide, epoxy resin, acrylic resin, phenol resin, BCB, PBO, or any other suitable polymer-based dielectric material. The dielectric layer 1310, for example, may be formed by suitable fabrication techniques, such as spin-on coating, CVD, PECVD, or the like. It should be noted that the number of the dielectric layers 1310 and the number of the redistribution conductive layers 1320 illustrated in FIG. 1O are merely for illustrative purposes, and the disclosure is not limited thereto. In some alternative embodiments, the number of the dielectric layers 1310 and the number of the redistribution conductive layers 1320 may be varied depending on the circuit design. In some embodiments, the redistribution structure 1300 is electrically connected to the TSVs 850. For example, the bottommost redistribution conductive layer 1320 physically contacts the TSVs 850 to establish electrical connection with the dies 800.

In some embodiments, the redistribution structure 1300 further includes a plurality of under-bump metallurgy (UBM) patterns 1330. The UBM patterns 1330 are electrically connected to the redistribution conductive layers 1320. In some embodiments, the UBM patterns 1330 are electrically connected to the TSVs 850 through the redistribution conductive layers 1320. In some embodiments, each of the UBM patterns 1330 is partially embedded in the topmost dielectric layer 1310.

As illustrated in FIG. 1O, the conductive terminals 1400 are disposed on the UBM patterns 1330. In some embodiments, the conductive terminals 1400 are attached to the UBM patterns 1330 through a solder flux. In some embodiments, the conductive terminals 1400 are, for example, solder balls, ball grid array (BGA) balls, or controlled collapse chip connection (C4) bumps. In some embodiments, the conductive terminals 1400 are made of a conductive material with low resistivity, such as Sn, Pb, Ag, Cu, Ni, Bi, or an alloy thereof.

Referring to FIG. 1O and FIG. 1P, a singulation process is performed on the scribe line regions SR to form a plurality of packages 10. In some embodiments, the dicing process or the singulation process typically involves dicing with a rotating blade or a laser beam. In other words, the dicing or singulation process is, for example, a laser cutting process, a mechanical cutting process, or other suitable processes. As illustrated in FIG. 1P, the die 800 is stacked on the die 200. In other words, multiple dies 200 and 800 are integrated into a single package 10. As such, the package 10 may be referred to as a "system on integrated circuit (SOIC) package." In some embodiments, the package 10 may be utilized in other modules/applications, such as chip on wafer on substrate (CoWoS) packaging, flip-chip packaging, integrated fan-out (InFO) packaging, fan-out wafer level packaging (WLP), or the like.

Figure 2:
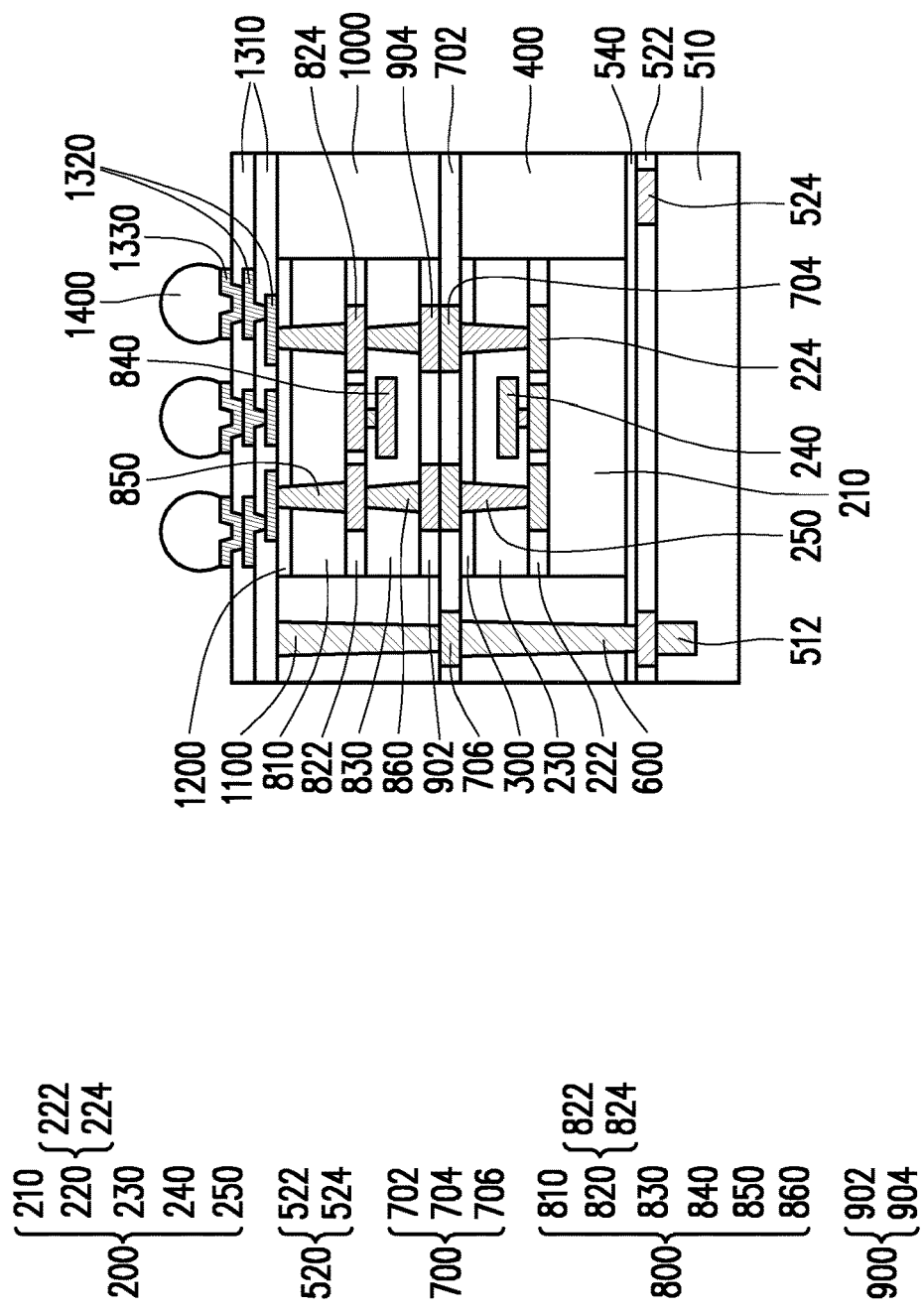
FIG. 2 is a schematic cross-sectional view illustrating a package in accordance with some alternative embodiments of the disclosure.

FIG. 2 is a schematic cross-sectional view illustrating a package 20 in accordance with some alternative embodiments of the disclosure. Referring to FIG. 2, the package 20 in FIG. 2 is similar to the package 10 in FIG. 1P, so similar components thereof are denoted by the same reference numeral and the detailed descriptions thereof are omitted herein. However, the dielectric layer 530 shown in the package 10 of FIG. 1P is omitted in the package 20 of FIG. 2. That is, the alignment marks 524 are directly in contact with the bonding layer 540. As illustrated in FIG. 2, the die 800 is stacked on the die 200. In other words, multiple dies 200 and 800 are integrated into a single package 20. As such, the package 20 may be referred to as a "SOIC package." In some embodiments, the package 20 may be utilized in other modules/applications, such as CoWoS packaging, flip-chip packaging, InFO packaging, fan-out WLP, or the like.

Figure 3A:
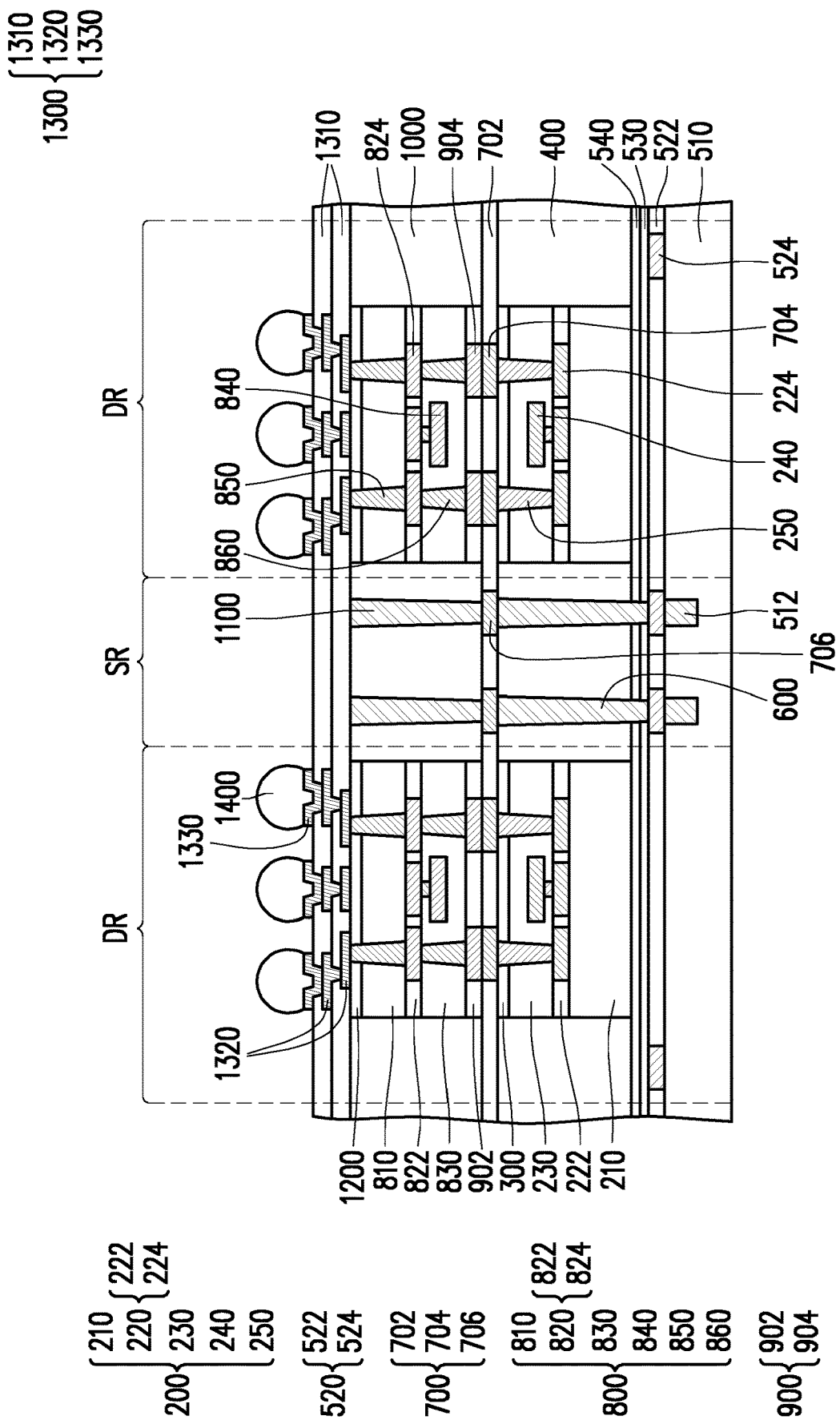
FIG. 3A to FIG. 3B are schematic cross-sectional views illustrating a manufacturing process of a package in accordance with some alternative embodiments of the disclosure.
Figure 3B:
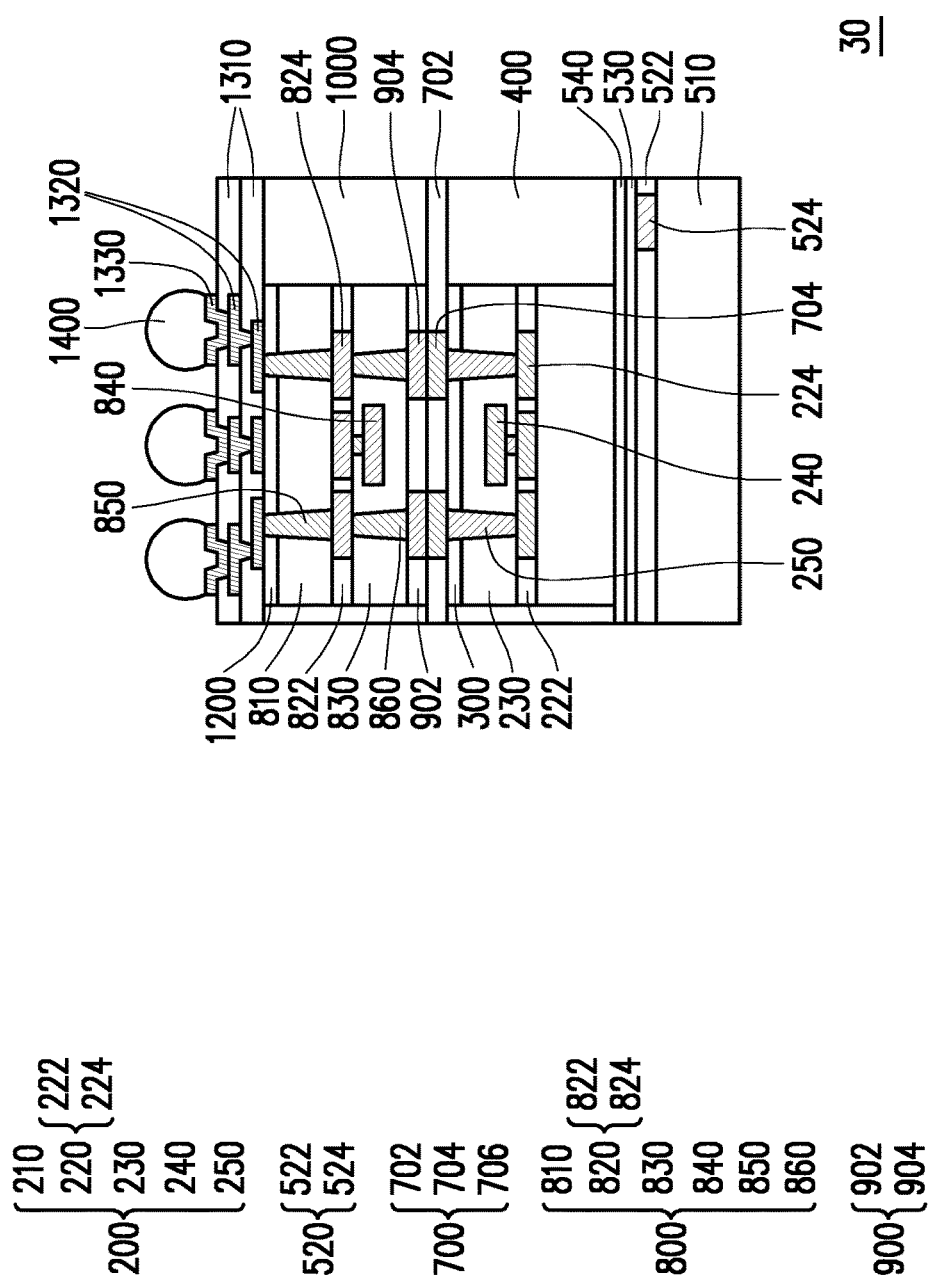

FIG. 3A to FIG. 3B are schematic cross-sectional views illustrating a manufacturing process of a package 30 in accordance with some alternative embodiments of the disclosure. Referring to FIG. 3A, the structure in FIG. 3A is similar to the structure in FIG. 1O, so similar components thereof are denoted by the same reference numeral and the detailed descriptions thereof are omitted herein. In other words, the structure in FIG. 3A may be obtained by performing the steps illustrated in FIG. 1A to FIG. 1O. However, in FIG. 3A, the contact vias 512, the alignment marks 524 connected to the contact vias 512, the TIVs 600, the connecting pads 706, and the TIVs 1100 are formed in the scribe line regions SR.

Referring to FIG. 3A and FIG. 3B, a singulation process is performed on the scribe line regions SR to form a plurality of packages 30. In other words, the contact vias 512, the alignment marks 524 connected to the contact vias 512, the TIVs 600, the connecting pads 706, and the TIVs 1100 located in the scribe line regions SR are removed. As illustrated in FIG. 3B, the die 800 is stacked on the die 200. In other words, multiple dies 200 and 800 are integrated into a single package 30. As such, the package 30 may be referred to as a "SOIC package." In some embodiments, the package 30 may be utilized in other modules/applications, such as CoWoS packaging, flip-chip packaging, InFO packaging, fan-out WLP, or the like.

Figure 4A:
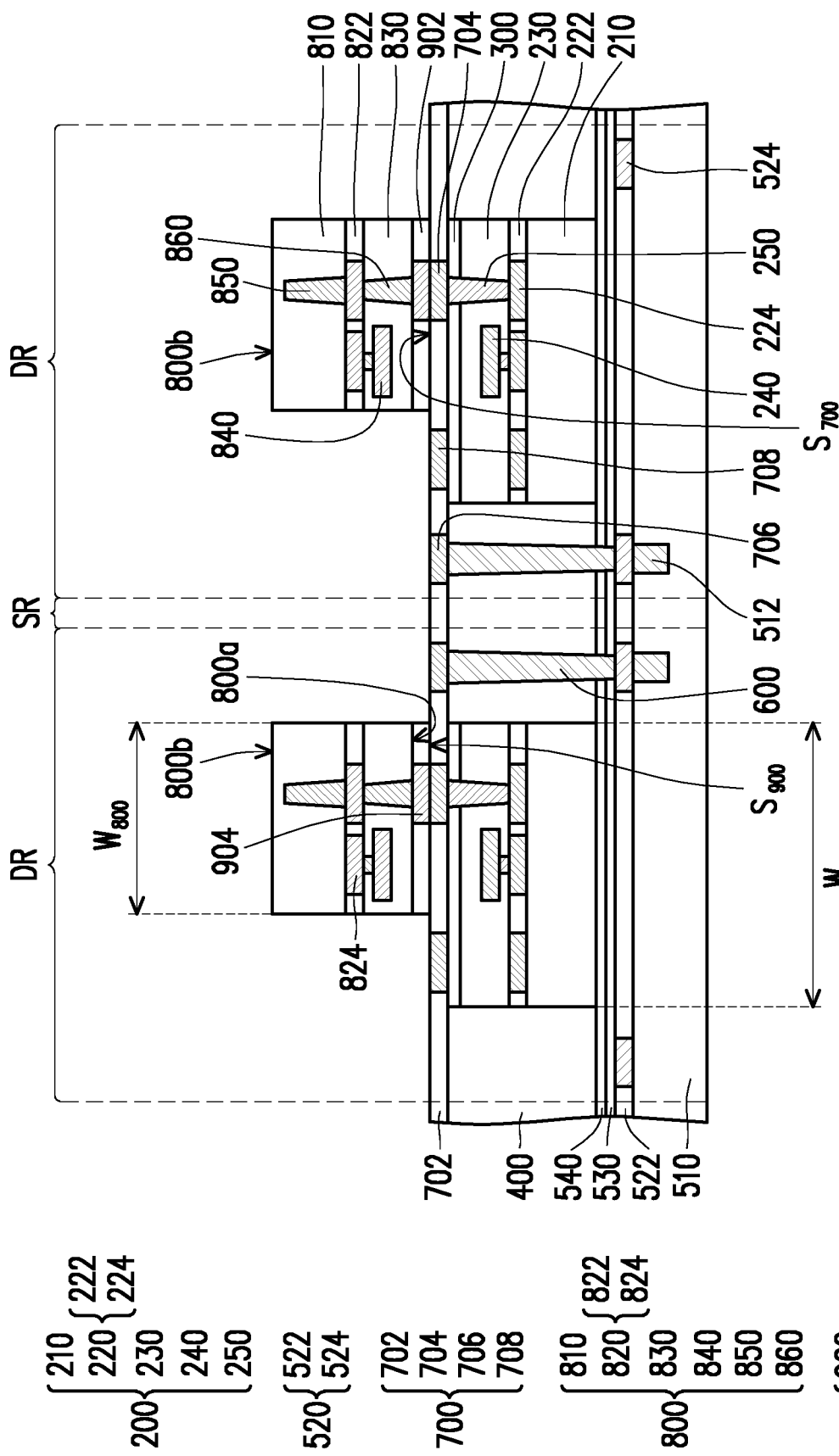
FIG. 4A to FIG. 4H are schematic cross-sectional views illustrating a manufacturing process of a package in accordance with some alternative embodiments of the disclosure.

FIG. 4A to FIG. 4H are schematic cross-sectional views illustrating a manufacturing process of a package 40 in accordance with some alternative embodiments of the disclosure. Referring to FIG. 4A, the structure in FIG. 4A is similar to the structure in FIG. 1I, so similar components thereof are denoted by the same reference numeral and the detailed descriptions thereof are omitted herein. In other words, the structure in FIG. 4A may be obtained by performing the steps illustrated in FIG. 1A to FIG. 1I. However, as illustrated in FIG. 4A, the bonding layer 700 further includes a plurality of auxiliary bonding pads 708. In addition, a size of each die 800 is different from a size of the corresponding die 200. In some embodiments, the size of each die 800 is smaller than the size of the corresponding die 200. For example, a width $W_{800}$ of each die 800 is smaller than a width $W_{200}$ of each die 200. In some embodiments, the dies 800 are placed such that the auxiliary connecting pads 708 are exposed. In some embodiments, the auxiliary connecting pads 708 may be made of the same material as that of the bonding pads 704 and the connecting pads 706. For example, the auxiliary connecting pads 708 may be made of aluminum, titanium, copper, nickel, tungsten, or alloys thereof. In some embodiments, the bonding pads 704, the connecting pads 706, and the auxiliary connecting pads 708 may be simultaneously formed.

Figure 4B:
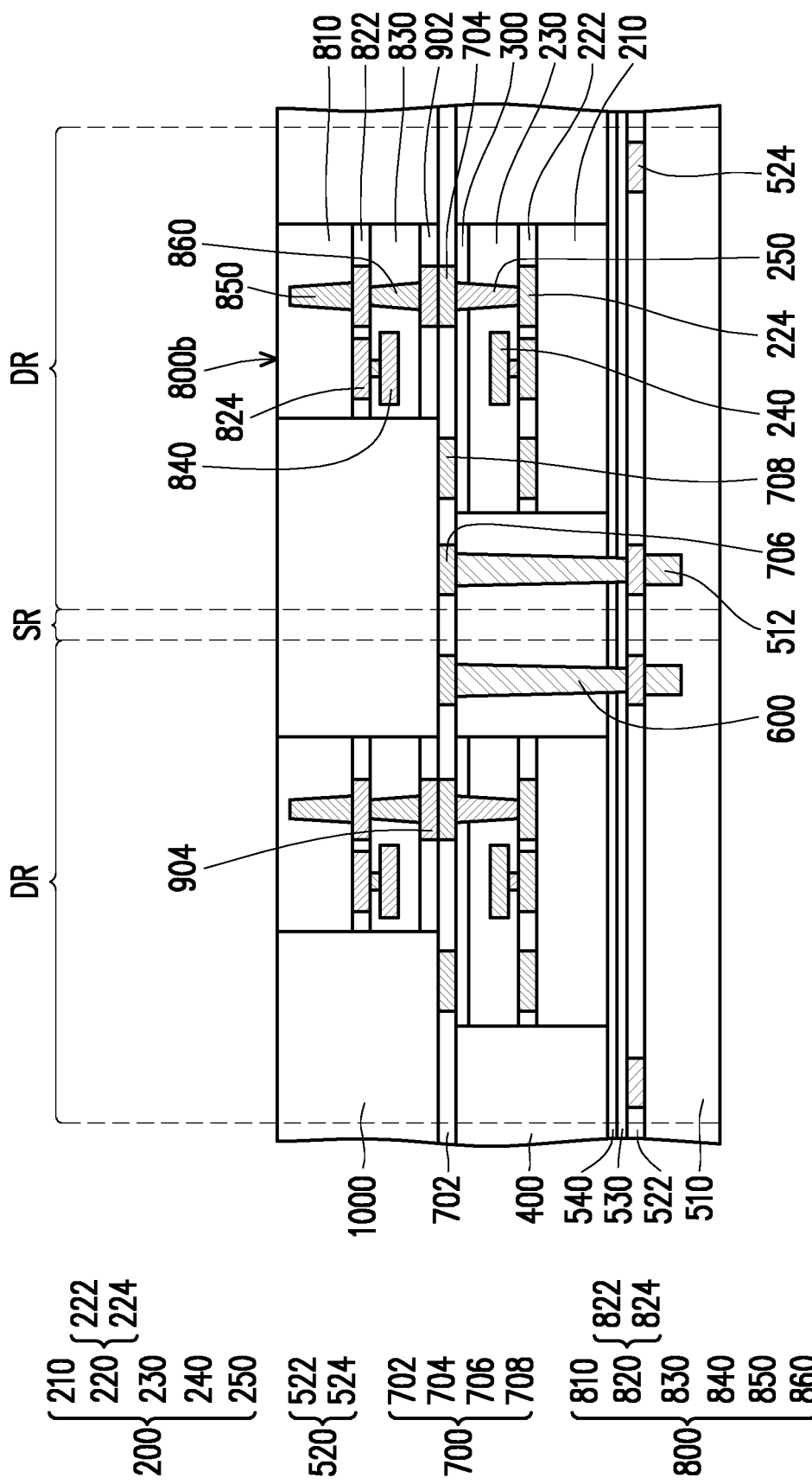

Referring to FIG. 4B, an encapsulant 1000 is formed to laterlaly encapsulate the dies 800 and the bonding layer 900. The step in FIG. 4B is similar to the step shown in FIG. 1J, so similar components thereof are denoted by the same reference numeral and the detailed descriptions thereof are omitted herein.

Figure 4C:
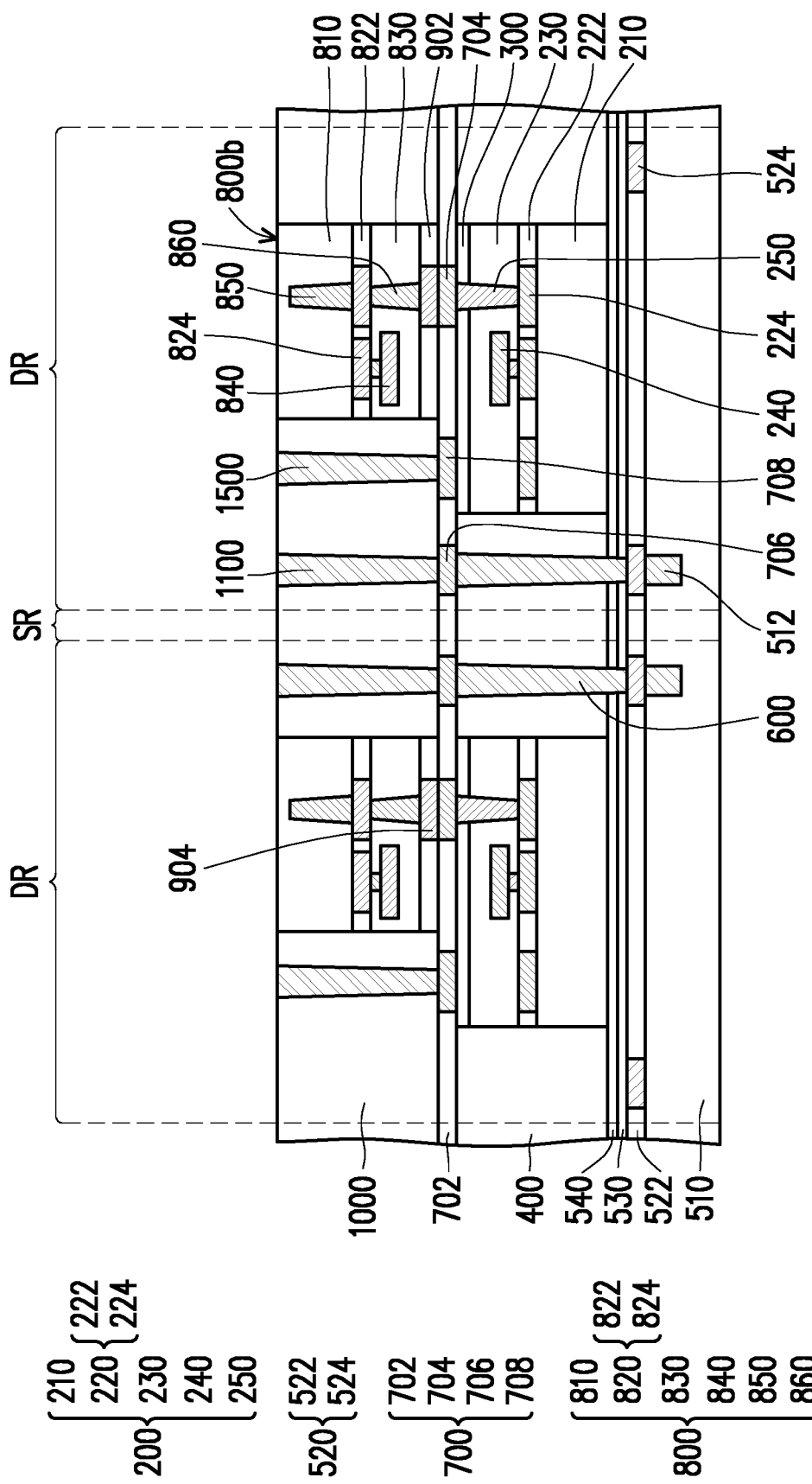

Referring to FIG. 4C, a plurality of TIVs 1100 and a plurality of auxiliary TIVs 1500 are formed in the encapsulant 1000. In some embodiments, the TIVs 1100 and the auxiliary TIVs 1500 are formed aside the dies 800. In some embodiments, the TIVs 1100 penetrate through the encapsulant 1000 to be in direct contact with the connecting pads 706. In some embodiments, the TIVs 1100 are electrically connected to the connecting pads 706. In other words, the TIVs 1100 are electrically grounded through the connecting pads 706, the TIVs 600, the alignment marks 524, and the contact vias 512. As illustrated in FIG. 4C, the TIVs 1100 are substantially aligned with the TIVs 600. In some embodiments, the auxiliary TIVs 1500 penetrate through the encapsulant 1000 to be in direct contact with the auxiliary connecting pads 708. For example, the auxiliary TIVs 1500 are electrically connected to the auxiliary connecting pads 708. In some embodiments, the TIVs 1100 and the auxiliary TIVs 1500 may be formed by the same material. For example, a material of the TIVs 1100 and the auxiliary TIVs 1500 includes aluminum, titanium, copper, nickel, tungsten, and/or alloys thereof. In some embodiments, the TIVs 1100 and the auxiliary TIVs 1500 may be formed simultaneously. For example, the TIVs 1100 and the auxiliary TIVs 1500 may be formed by the following steps. First, a laser drilling or an etching process is performed on the encapsulant 1000 to form a plurality of openings (not shown). The openings expose at least a portion of each connecting pad 706 and at least a portion of each auxiliary connecting pad 708. Thereafter, a plating process may be performed to fill the openings, so as to form the TIVs 1100 and the auxiliary TIVs 1500. However, the disclosure is not limited thereto. In some alternative embodiments, the auxiliary TIVs 1500 may be formed prior to or after the formation of the TIVs 1100.

Figure 4D:
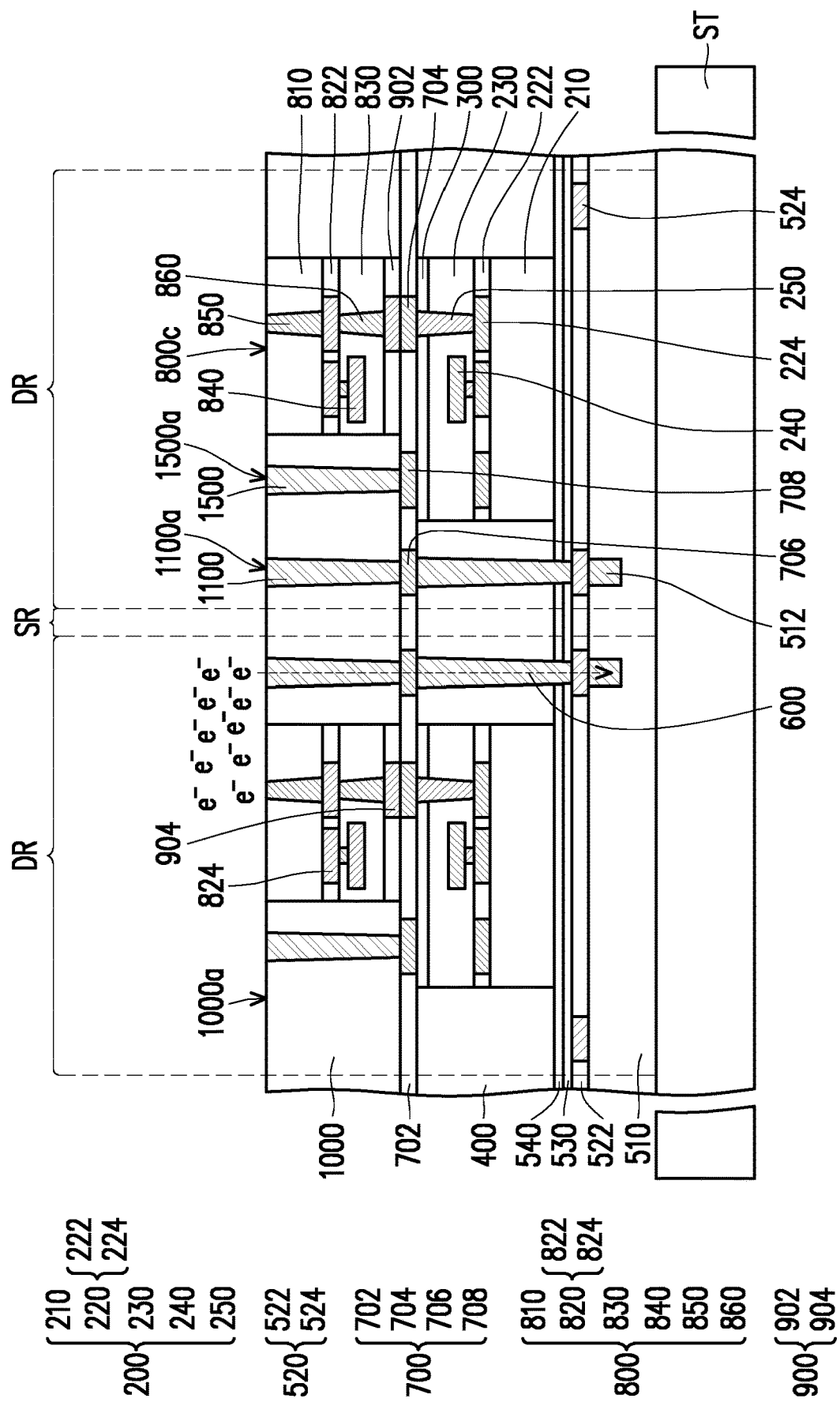

Referring to FIG. 4C and FIG. 4D, the structure illustrated in FIG. 4C is placed on a thinning stage ST. In some embodiment, the thinning stage ST may be electrically connected to a ground. Subsequently, the dies 800, the encapsulant 1000, the TIVs 1100, and the auxiliary TIVs 1500 are thinned until the TSVs 850 of the dies 800 are exposed. That is, the dies 800 are thinned from the rear surfaces 800*b*. In some embodiments, the dies 800, the encapsulant 1000, the TIVs 1100, and the auxiliary TIVs 1500 may be thinned or planarized through a grinding process, such as a mechanical grinding process, a CMP process, or the like. In some embodiments, after the TSVs 850 are exposed, the dies 800, the encapsulant 1000, the TIVs 1100, and the auxiliary TIVs 1500 may be further thinned to reduce the overall thickness of the dies 800. After the thinning process, rear surfaces 800*c* of the dies 800 are substantially coplanar with a top surface 1000*a* of the encapsulant 1000, top surfaces 1100*a* of the TIVs 1100, and top surfaces 1500*a* of the auxiliary TIVs 1500. As illustrated in FIG. 4D, after the thinning process, the TSVs 850 penetrate through the semiconductor substrates 810 of the dies 800.

In some embodiments, during the thinning process, electrons may be generated and accumulated at the grinding surface (i.e. the rear surfaces 800*c* of the dies 800, the top surface 1000*a* of the encapsulant 1000, the top surfaces 1100*a* of the TIVs 1100, and the top surfaces 1500*a* of the TIVs 1500). The accumulation of the electron would cause corrosion issues to the TSVs 850, the TIVs 1100, and the auxiliary TIVs 1500. Nevertheless, since the TIVs 1100 are electrically grounded, the TIVs 1100 are able to create a path to deplete the accumulated electrons. In other words, the accumulated electron would be pulled down and travels sequentially through the TIVs 1100, the connecting pads 706, the TIVs 600, and the alignment marks 524 to arrive at the contact vias 512, as illustrated in FIG. 4D. The electrons in the contact vias 512 may be further transfer out of the structure. As such, the issue of corrosion derived from electron accumulation may be resolved.

Figure 4E:
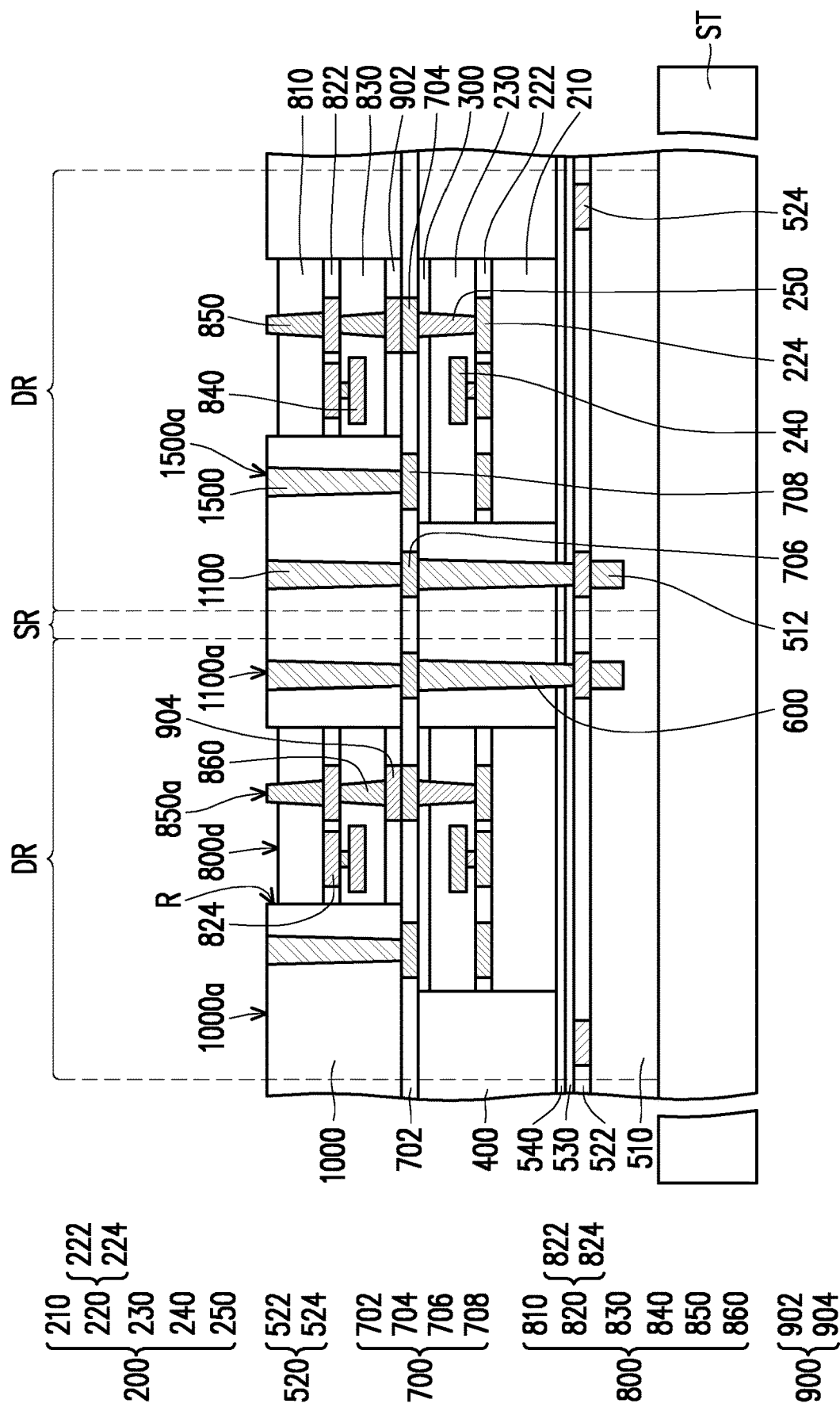
Figure 4F:
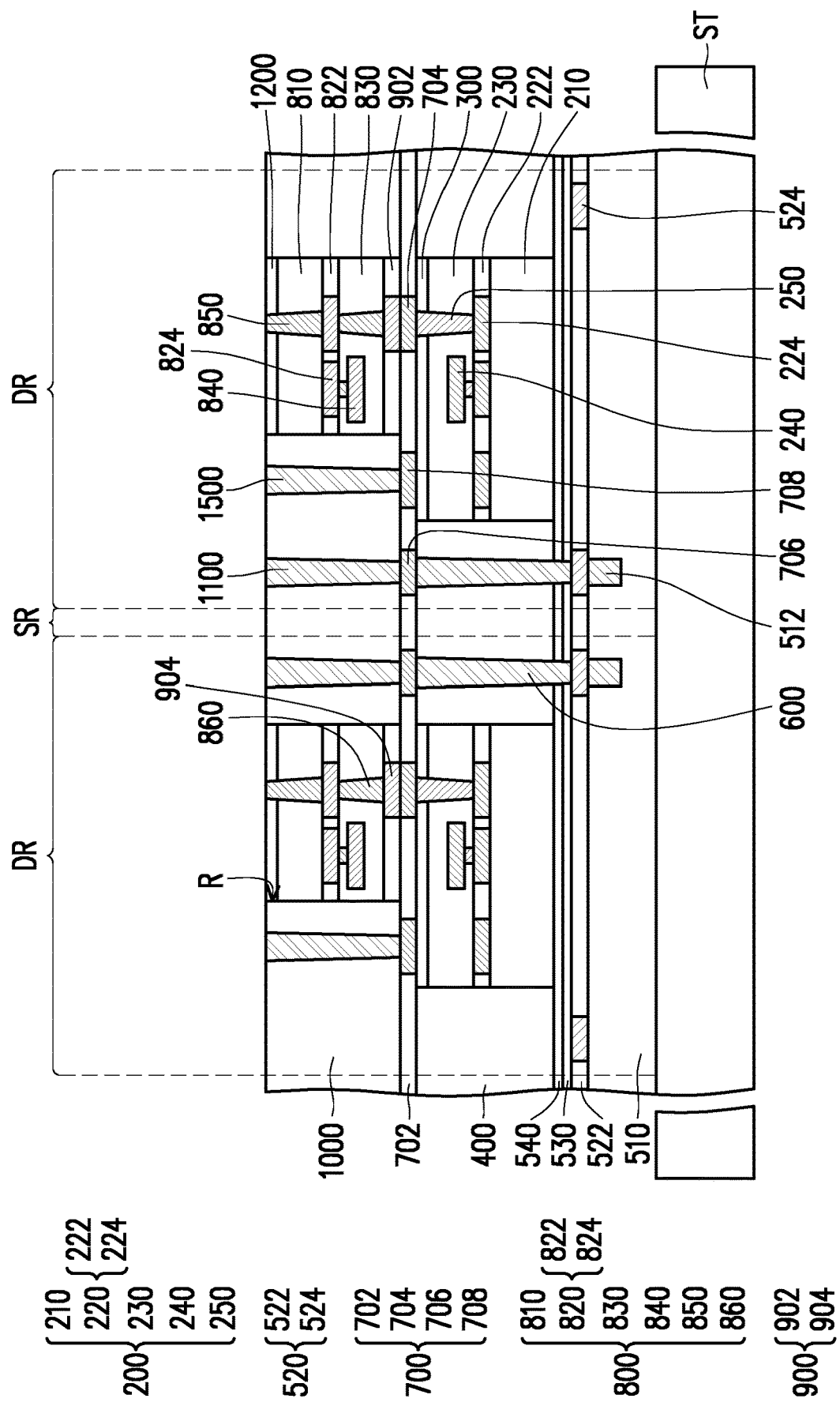
Figure 4G:
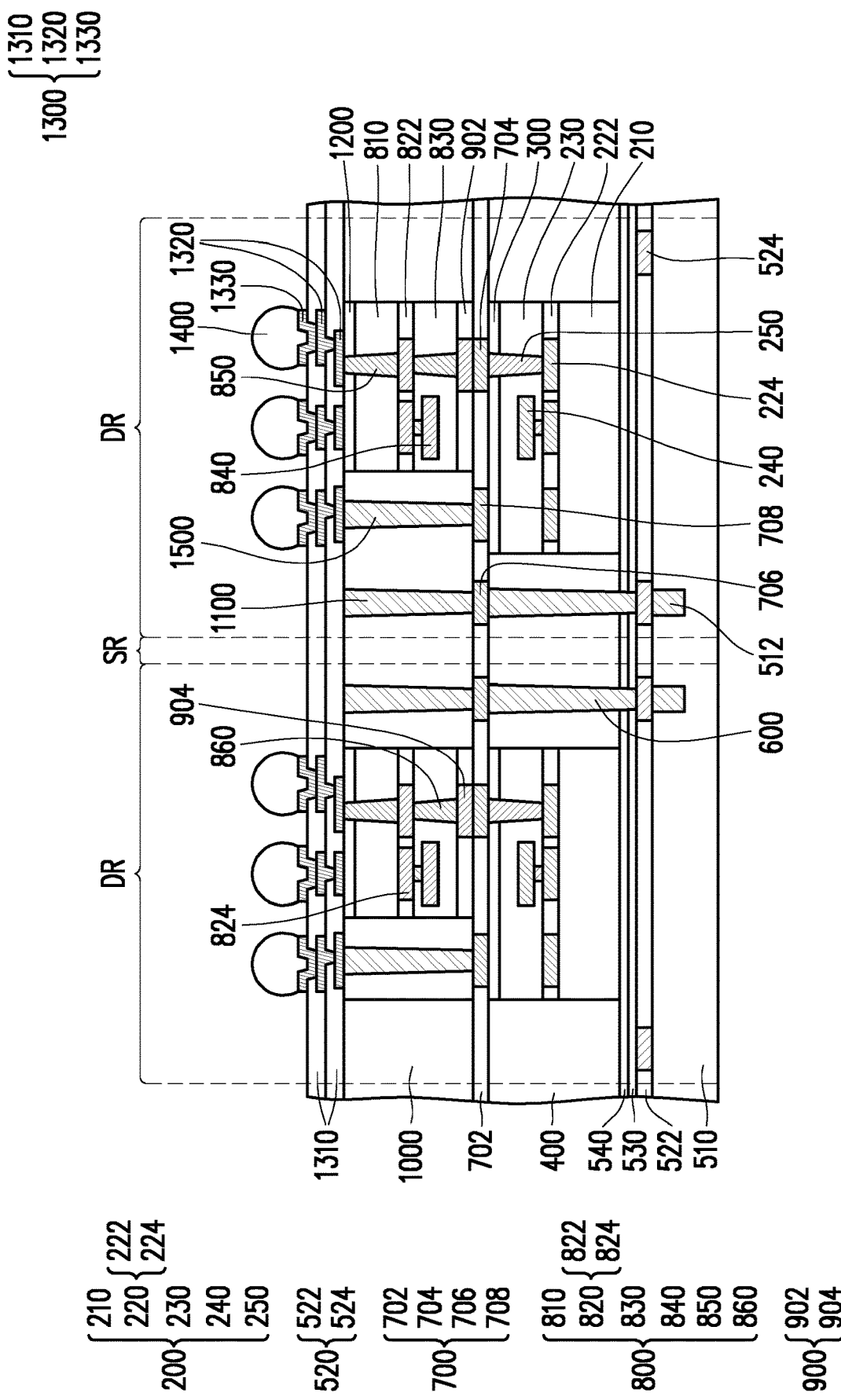

Referring to FIG. 4E to FIG. 4G, the steps in FIG. 4E to FIG. 4G are similar to the steps shown in FIG. 1M and FIG. 1O, so similar components thereof are denoted by the same reference numeral and the detailed descriptions thereof are omitted herein. As illustrated in FIG. 4G, the bottommost redistribution conductive layer 1320 is directly in contact with the auxiliary TIVs 1500. In other words, the redistribution structure 1300 is electrically connected to the auxiliary TIVs 1500. In some embodiments, the auxiliary TIVs 1500 electrically connects the auxiliary connecting pads 708 and the redistribution structure 1300.

Figure 4H:
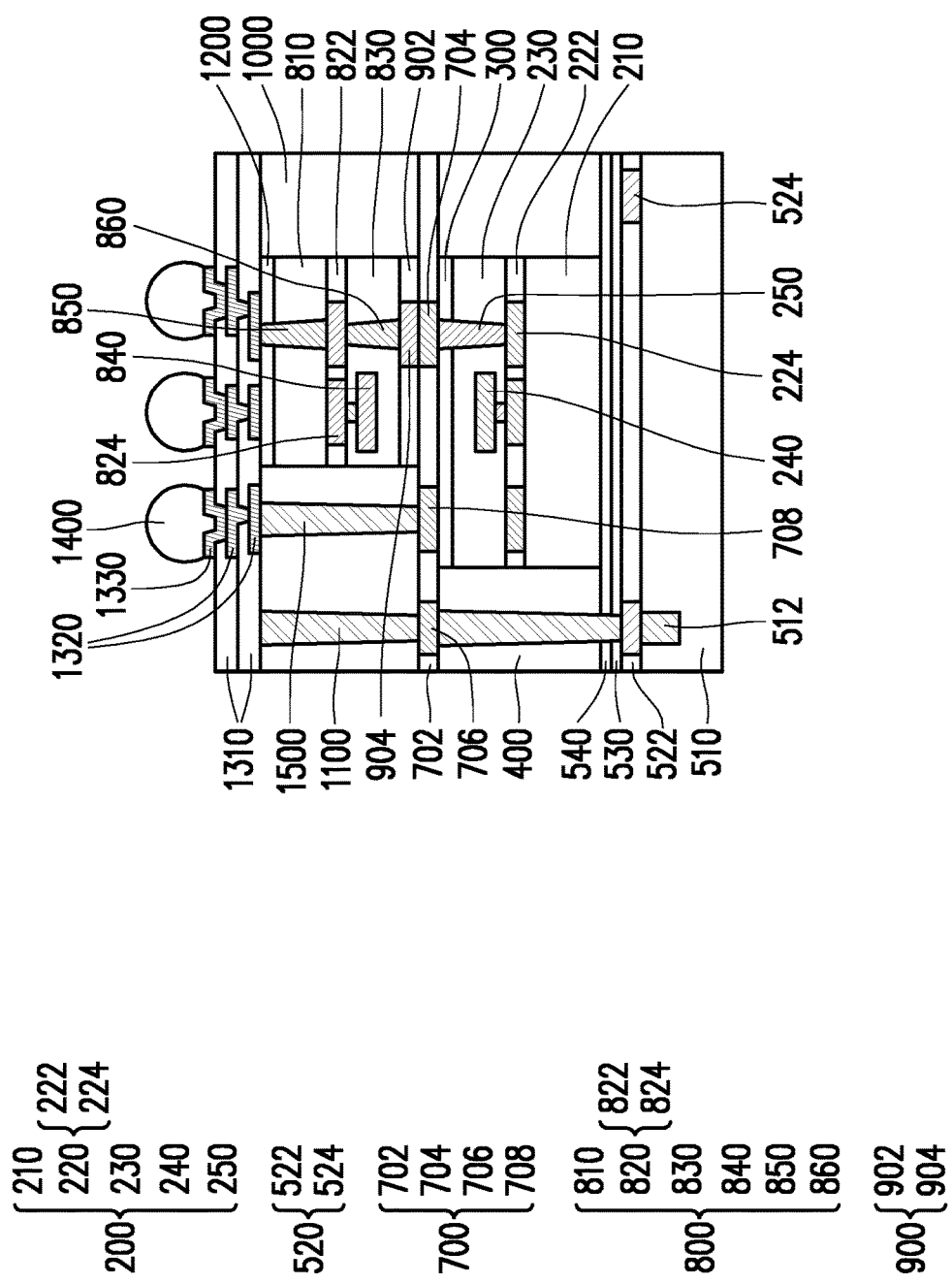

Referring to FIG. 4G and FIG. 4H, a singulation process is performed on the scribe line regions SR to form a plurality of packages 40. As illustrated in FIG. 4H, the die 800 is stacked on the die 200. In other words, multiple dies 200 and 800 are integrated into a single package 40. As such, the package 40 may be referred to as a "system on integrated circuit (SOIC) package." In some embodiments, the package 10 may be utilized in other modules/applications, such as chip on wafer on substrate (CoWoS) packaging, flip-chip packaging, integrated fan-out (InFO) packaging, fan-out wafer level packaging (WLP), or the like.

Figure 5:
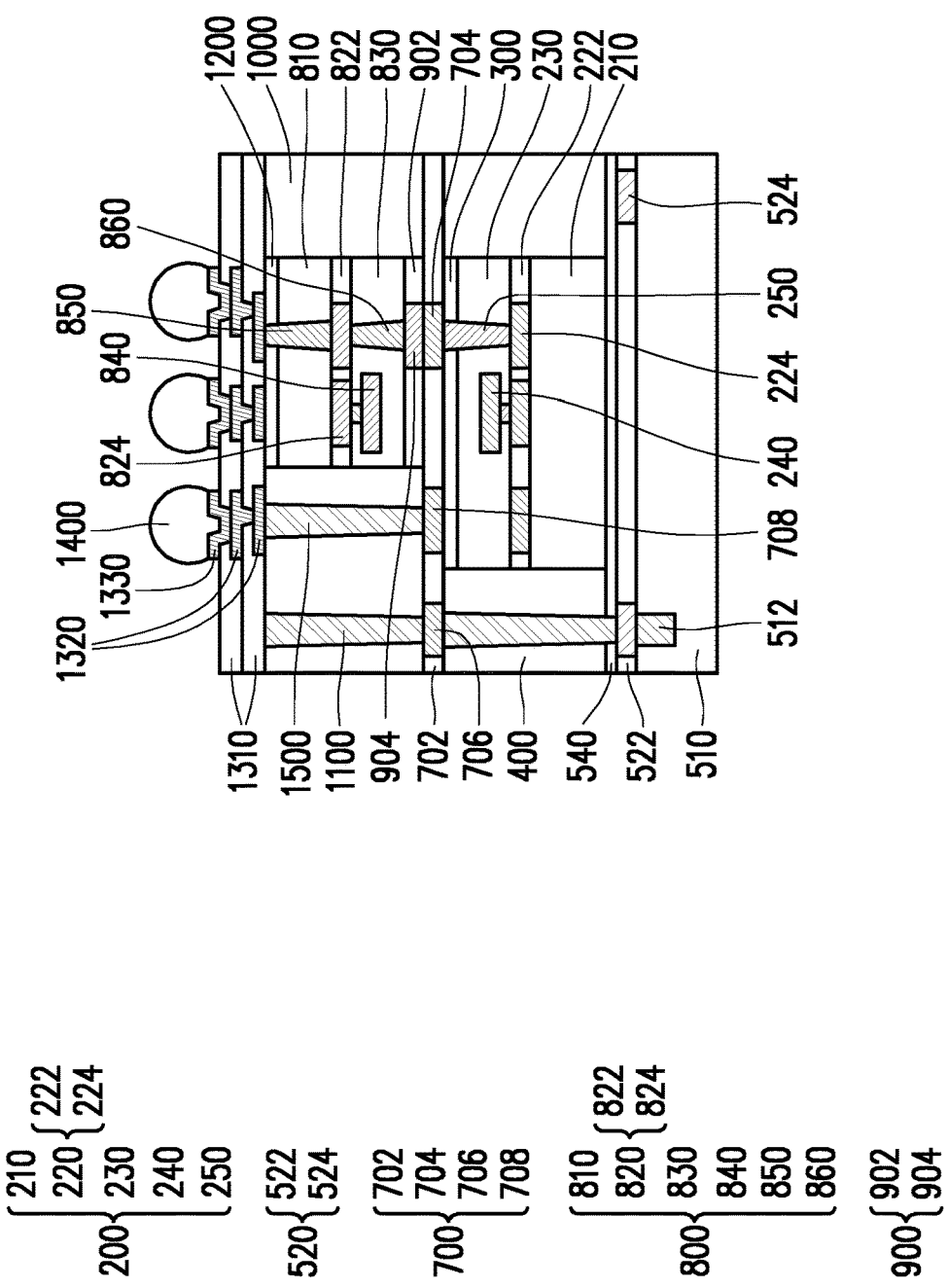
FIG. 5 is a schematic cross-sectional view illustrating a package in accordance with some alternative embodiments of the disclosure.

FIG. 5 is a schematic cross-sectional view illustrating a package 50 in accordance with some alternative embodiments of the disclosure. Referring to FIG. 5, the package 50 in FIG. 5 is similar to the package 40 in FIG. 4H, so similar components thereof are denoted by the same reference numeral and the detailed descriptions thereof are omitted herein. However, the dielectric layer 530 shown in the package 40 of FIG. 4H is omitted in the package 50 of FIG. 5. That is, the alignment marks 524 are directly in contact with the bonding layer 540. As illustrated in FIG. 5, the die 800 is stacked on the die 200. In other words, multiple dies 200 and 800 are integrated into a single package 50. As such, the package 50 may be referred to as a "SOIC package." In some embodiments, the package 50 may be utilized in other modules/applications, such as CoWoS packaging, flip-chip packaging, InFO packaging, fan-out WLP, or the like.

In accordance with some embodiments of the disclosure, a package includes a semiconductor carrier, a first die, a second die, a first encapsulant, a second encapsulant, a first through insulating via (TIV), and a second TIV. The semiconductor carrier has a contact via embedded therein. The contact via is electrically grounded. The first die is disposed over the semiconductor carrier. The second die is stacked on the first die. The first encapsulant laterally encapsulates the first die. The second encapsulant laterally encapsulates the second die. The first TIV is aside the first die. The first TIV penetrates through the first encapsulant and is electrically connected to the contact via. The second TIV is aside the second die. The second TIV penetrates through the second encapsulant and is electrically connected to the contact via and the first TIV.

In accordance with some embodiments of the disclosure, a manufacturing method of a package includes at least the following steps. A first die is provided. The first die is laterally encapsulated by a first encapsulant. The first die and the first encapsulant are attached to a semiconductor carrier having contact vias embedded therein. The contact vias are electrically grounded. First through insulating vias (TIV) are formed in the first encapsulant. The first TIVs are electrically grounded through the contact vias. A second die is bonded to the first die. The second die includes a semiconductor substrate and through semiconductor vias (TSV) embedded in the semiconductor substrate. The second die is laterally encapsulated by a second encapsulant. Second TIVs are formed in the second encapsulant. The second TIVs are electrically grounded through the first TIVs and the contact vias. The second die, the second encapsulant, and the second TIVs are grinded until the TSVs of the second die are exposed. A redistribution structure is formed over the second die and the second encapsulant.

In accordance with some alternative embodiments of the disclosure, a manufacturing method of a package includes at least the following steps. A carrier is provided. First dies are placed on the carrier in an array. The first die is laterally encapsulated by a first encapsulant. The first die and the first encapsulant are attached to a semiconductor carrier having contact vias embedded therein. The semiconductor carrier has die regions and scribe line regions located between two adjacent die regions. The first dies are located in the die regions. The contact vias are located in the scribe line regions and are electrically grounded. The carrier is removed. First through insulating vias (TIV) are formed in the first encapsulant. The first TIVs are located in the scribe line regions and are electrically grounded through the contact vias. Second dies are bonded to the first dies. Each second die of the second dies includes a semiconductor substrate and through semiconductor vias (TSV) embedded in the semiconductor substrate. The second dies are laterally encapsulated by a second encapsulant. Second TIVs are formed in the second encapsulant. The second TIVs are located in the scribe line regions and are electrically grounded through the first TIVs and the contact vias. The second die, the second encapsulant, and the second TIVs are grinded until the TSVs of the second die are exposed. A singulation process is performed to remove the contact vias, the first TIVs, and the second TIVs located in the scribe line regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package, comprising:
a semiconductor carrier;
a first die disposed over the semiconductor carrier;
a second die stacked on the first die;
a redistribution structure over the second die; and
an electron transmission path extending from the semiconductor carrier to the redistribution structure, wherein the electron transmission path is electrically connected to a ground voltage, a first portion of the electron transmission path is embedded in the semiconductor carrier, a second portion of the electron transmission path is aside the first die, and a third portion of the electron transmission path is aside the second die.

2. The package of claim 1, wherein the first portion of the electron transmission path is a contact via and is directly in contact with the semiconductor carrier.

3. The package of claim 1, further comprising:
a first bonding layer over the first die and the second portion of the electron transmission path, wherein the first bonding layer comprises first bonding pads, a fourth portion of the electron transmission path is embedded in the first bonding layer, and the fourth portion of the electron transmission path is sandwiched between the second portion and the third portion of the electron transmission path; and
a second bonding layer sandwiched between the first bonding layer and the second die, wherein the second bonding layer comprises second bonding pads, and the first bonding pads are hybrid bonded to the second bonding pads.

4. The package of claim 3, wherein the first die comprises:
a first semiconductor substrate;
a first interconnection structure over the first semiconductor substrate;
a first passivation layer over the first interconnection structure; and
first bonding vias penetrating through the first passivation layer, wherein the first bonding vias electrically connect the first interconnection structure and the first bonding pads.

5. The package of claim 3, wherein the second die comprises:
a second semiconductor substrate;
through semiconductor vias (TSV) penetrating through the second semiconductor substrate and electrically connected to the redistribution structure;
a second interconnection structure over the second semiconductor substrate and electrically connected to the TSVs;
a second passivation layer over the second interconnection structure; and
second bonding vias penetrating through the second passivation layer, wherein the second bonding vias electrically connect the second interconnection structure and the second bonding pads.

6. The package of claim 3, wherein the first bonding layer further comprises an auxiliary connecting pad, the package further comprises an auxiliary TIV aside the second die and the third portion of the electron transmission path, and the auxiliary TIV electrically connects the auxiliary connecting pad and the redistribution structure.

7. The package of claim 1, further comprising an alignment layer between the semiconductor carrier and the first die, wherein a fifth portion of the electron transmission path is embedded in the alignment layer.

8. The package of claim 7, wherein the fifth portion of the electron transmission path is sandwiched between the first portion and the second portion of the electron transmission path.

9. The package of claim 8, further comprising a dielectric layer between the alignment layer and the first die, wherein the second portion of the electron transmission path penetrates through the dielectric layer.

10. A manufacturing method of a package, comprising:
laterally encapsulating a first die by a first encapsulant;
attaching the first die and the first encapsulant to a semiconductor carrier having contact vias embedded therein, wherein the contact vias are electrically connected to a ground voltage;
forming first through insulating vias (TIV) aside the first die, wherein the first TIVs are partially embedded in the first encapsulant and are electrically connected to the ground voltage;
bonding a second die to the first die;
laterally encapsulating the second die by a second encapsulant;
forming second TIVs aside the second die, wherein the second TIVs are embedded in the second encapsulant and are electrically connected to the first TIVs and the ground voltage; and
forming a redistribution structure over the second die and the second encapsulant,
wherein the contact vias form a first portion of an electron transmission path, the first TIVs form a second portion of the electron transmission path, and the second TIVs form a third portion of the electron transmission path, such that the electron transmission path extends from the semiconductor carrier to the redistribution structure and is electrically connected to the ground voltage.

11. The method of claim 10, wherein bonding the second die to the first die comprises:
forming a first bonding layer over the first die, the first encapsulant, and the first TIVs;
stacking the second die having a second bonding layer formed thereon on the first bonding layer, wherein the first bonding layer is hybrid bonded to the second bonding layer.

12. The method of claim 10, further comprising forming an auxiliary TIV embedded in the second encapsulant, wherein the auxiliary TIV is electrically connected to the redistribution structure.

13. The method of claim 12, wherein the auxiliary TIV and the second TIVs are simultaneously formed.

14. The method of claim 10, further comprising:
forming an alignment layer between the semiconductor carrier and the first encapsulant, wherein the electron transmission path further comprises alignment marks, and the alignment marks are embedded in the alignment layer.

15. The method of claim 14, wherein the alignment marks are in physical contact with the contact vias and the first TIVs.

16. The method of claim 14, further comprising:
forming a dielectric layer between the alignment layer and the first encapsulant, wherein the first TIVs are further partially embedded in the dielectric layer.

17. The method of claim 10, wherein the second die comprises a semiconductor substrate and through semiconductor vias (TSV) embedded in the semiconductor substrate, and the method further comprises:

grinding the second die, the second encapsulant, and the second TIVs until the TSVs of the second die are exposed, wherein during the grinding of the second die, the second encapsulant, and the second TIVs, electrons generated from the grinding travels through the electron transmission path from a grinding surface.

18. A manufacturing method of a package, comprising:
laterally encapsulating first dies by a first encapsulant;
attaching the first dies and the first encapsulant to a semiconductor carrier having contact vias embedded therein, wherein the semiconductor carrier has first regions and second regions located between two adjacent first regions, the first dies are located in the first regions, the contact vias are located in the second regions, and the contact vias are electrically connected to a ground voltage;
forming first through insulating vias (TIV) partially embedded in the first encapsulant, wherein the first TIVs are located in the second regions and are electrically connected to the ground voltage such that the first TIVs are aside the first die;
bonding second dies to the first dies;
laterally encapsulating the second dies by a second encapsulant;
forming second TIVs embedded in the second encapsulant, wherein the second TIVs are located in the second regions and are aligned with the first TIVs such that the second TIVs are aside the second die, and the second TIVs are electrically connected to a ground voltage;
forming a redistribution structure over the second die and the second encapsulant, wherein the contact vias form a first portion of an electron transmission path, the first TIVs form a second portion of the electron transmission path, and the second TIVs form a third portion of the electron transmission path such that the electron transmission path extends from the semiconductor carrier to the redistribution structure and is electrically connected to the ground voltage; and
performing a singulation process to remove the electron transmission path.

19. The method of claim 18, further comprising forming an auxiliary TIV embedded in the second encapsulant, wherein the auxiliary TIV and the second TIVs are simultaneously formed.

20. The method of claim 18, further comprising:
forming an alignment layer between the semiconductor carrier and the first encapsulant, wherein the electron transmission path further comprises alignment marks, and the alignment marks are embedded in the alignment layer.

* * * * *